United States Patent
Mordarski et al.

(10) Patent No.: US 12,046,869 B1
(45) Date of Patent: Jul. 23, 2024

(54) METHODS AND DEVICES FOR FIXING OPTICS TO MECHANICAL MOUNTS IN HIGH-POWER LASER SYSTEMS

(71) Applicant: PANASONIC INTELLECTUAL PROPERTY MANAGEMENT CO. LTD, Osaka (JP)

(72) Inventors: Mark Mordarski, Tewksbury, MA (US); Bryan Lochman, Nashville, TN (US); Michael Miceli, Cookeville, TN (US); Connor Baker, Cheshire, CT (US)

(73) Assignee: PANASONIC INTELLECTUAL PROPERTY MANAGEMENT CO. LTD, Osaka (JP)

( * ) Notice: Subject to any disclaimer, the term of this patent is extended or adjusted under 35 U.S.C. 154(b) by 659 days.

(21) Appl. No.: 17/321,671

(22) Filed: May 17, 2021

Related U.S. Application Data

(60) Provisional application No. 63/026,896, filed on May 19, 2020.

(51) Int. Cl.
| | |
|---|---|
| *H01S 3/08* | (2023.01) |
| *H01S 5/02325* | (2021.01) |
| *H01S 5/14* | (2006.01) |
| *H01S 5/40* | (2006.01) |
| *F16B 2/24* | (2006.01) |

(52) U.S. Cl.
CPC .......... *H01S 5/02325* (2021.01); *H01S 5/141* (2013.01); *H01S 5/4012* (2013.01); *H01S 5/4087* (2013.01); *F16B 2/243* (2013.01)

(58) Field of Classification Search
CPC .... H01S 5/02325; H01S 5/141; H01S 5/4012; H01S 5/4087
See application file for complete search history.

(56) References Cited

U.S. PATENT DOCUMENTS

| | | | |
|---|---|---|---|
| 10,131,268 B2 * | 11/2018 | Mayer | F21S 41/16 |
| 2004/0187326 A1 * | 9/2004 | Yung | G01C 15/004 33/286 |
| 2004/0217092 A1 * | 11/2004 | Demers | G02B 7/00 219/86.25 |
| 2005/0117365 A1 * | 6/2005 | Menke | B60Q 1/0064 362/555 |
| 2009/0207410 A1 * | 8/2009 | Liu | G02B 7/1825 356/399 |
| 2012/0250487 A1 * | 10/2012 | Yoshinaga | G11B 7/22 369/100 |
| 2015/0241037 A1 * | 8/2015 | Zhang | F21S 8/026 362/308 |

(Continued)

*Primary Examiner* — Kinam Park
(74) *Attorney, Agent, or Firm* — Morgan, Lewis & Bockius LLP

(57) ABSTRACT

In various embodiments, a spring is utilized to fix an optic to a mechanical mount in a laser system. Such springs may consist of a single length of elastic material having first and second ends. The length of elastic material may define first and second off-center bends providing first and second base portions, as well as a central bend that is generally U-shaped and that defines first and second contact portions. The first and second contact portions are opposed to each other across the central bend to thereby resist compression of the first and second contact portions toward the first and second base portions.

19 Claims, 31 Drawing Sheets

(56) References Cited

U.S. PATENT DOCUMENTS

| | | | |
|---|---|---|---|
| 2016/0004027 A1* | 1/2016 | Marcinuk | F16C 11/103 |
| | | | 403/91 |
| 2016/0085083 A1* | 3/2016 | Murota | G02B 27/48 |
| | | | 353/38 |
| 2020/0348001 A1* | 11/2020 | Spicer | F21K 9/20 |

* cited by examiner

METHODS AND DEVICES FOR FIXING OPTICS TO MECHANICAL MOUNTS IN HIGH-POWER LASER SYSTEMS

RELATED APPLICATIONS

This application claims the benefit of and priority to U.S. Provisional Patent Application No. 63/026,896, filed May 19, 2020, the entire disclosure of which is hereby incorporated herein by reference.

TECHNICAL FIELD

In various embodiments, the present invention relates to laser systems, specifically laser systems in which optical elements, utilized to manipulate and/or route laser beams, are fixed to mechanical mounts.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Laser systems, or "resonators," such as WBC resonators, typically utilize multiple optical elements (or "optics") for the redirection and/or manipulation of laser beams before the beams are output and used for, e.g., processing of workpieces. In passive applications where an optic is fixed and does not have any active degrees of freedom for alignment, stability of the optical assembly is critical to the function of the system. While various techniques such as adhesives exist for fixing optics to mechanical mounts, such techniques may lack sufficient stability and/or deform, for example, due to thermal effects, during system operation or after thermal cycling of the system. Thus, there is a need for devices, systems, and techniques of fixing optics to mechanical mounts in a laser resonator that is cost-effective, easy to implement, and robust during repeated system operation.

SUMMARY

Embodiments of the invention include springs that are designed and engineered to firmly fix an optic to and/or partially within a mechanical mount for use within or in conjunction with a laser system. In various embodiments, the spring clamps (or "holds" or "fixes") an optic in place between feature(s) of the spring and feature(s) of the mount in a very stable and repeatable way that greatly reduces the cost of manufacturing and complexity of assembly compared to other optic-fixation techniques. Springs in accordance with embodiments of the invention may be utilized with multiple different optics (e.g., having different shapes and/or sizes) and even in conjunction with different types of mechanical mounts. As utilized herein, a mechanical mount (or simply, a "mount") is a component that is utilized to hold an optic in a specific position and/or orientation. Mechanical mounts typically include, consist essentially of, or consist of a material different from that of the optic itself. For example, optics may be transparent, at least to the wavelengths of laser energy manipulated by the optics, while mounts may be opaque to such radiation and include, consist essentially of, or consist of a material such as a metal or a ceramic. In contrast, optics may include, consist essentially of, or consist of a material such as glass, fused silica, sapphire, or a polymeric material.

In accordance with various embodiments of the invention, the spring includes, consists essentially of, or consists of a single length of an elastic material having first and second opposing ends, and which has or defines two off-center bends as well as a central, generally U-shaped bend between the off-center bends. The off-center bends define a pair of substantially collinear base portions in which the opposing ends of the elastic material face each other. The central bend connects the off-center bends together and defines two contact portions opposed to each other across the central bend. In various embodiments, the spring is elastically compressed to accommodate placement of the optic on or within the mount. In typical applications, the contact portions of the spring contact the optic while the base portions contact portions of the mount, and the resulting spring force firmly fixes the optic in place on the mount.

In various embodiments, the spring is symmetric (or substantially symmetric) across a mirror plane bisecting the central U-shaped bend. However, due to, for example, manufacturing tolerances, the center of the "central bend" need not be positioned exactly at the middle point of the spring. Rather, the position of the center of the central bend may be, e.g., +5%, +2%, or ±1% of the exact middle point of the spring. As utilized herein, base portions of the spring are "substantially collinear" when within 0.5°, 10, 2°, or 5° of collinearity. In addition, a "single length" of elastic material includes not only a unitary piece of the elastic material, but also a length composed of multiple pieces, joined longitudinally and/or stacked vertically, which are joined together so as to deform as a single unit.

Various aspects of the spring, e.g., dimensions, materials, material properties, radii, angles, etc., may be varied, in accordance with embodiments of the invention, while retaining the basic properties and functionality of the spring. For example, the spring force and/or overall size and/or shape of the spring may be varied to accommodate a particular optic and/or mount. In various embodiments, the spring (and/or mechanical mount) may be designed to apply a desired force to the optic to hold it in place, and the magnitude of this force may be determined, at least in part, by the requirements of the laser system (and/or the particular optic) and/or the application. For example, the force may be sufficient so that the static friction exceeds the forces the optic would experience from shock and vibration, while still being sufficiently small to avoid cracking, creep, or birefringence of the optic. Variations of the properties and/or relative dimensions of the spring may enable optimization of the spring constant (and resulting spring force) for a host of different applications.

Embodiments of the invention also include techniques and devices for utilizing the spring to fix an optic on a mechanical mount. In various embodiments, the spring is placed on the mount such that the base portions are situated against one or more portions of the mount. For example, the spring may be placed on a region of the mount, all or a portion of which is recessed below the top surface of the mount. Alternatively, the base portions may engage against raised portions of the mount, all or portions of which are elevated over the remaining top surface of the mount. As utilized herein, the "spring cradle" (or simply, "cradle") of the mount refers to the portion of the mount, recessed or not, configured (e.g., sized and shaped) to receive the spring. Similarly, the "optic cradle" of the mount is the portion of the mount, recessed or not, configured to receive the optic and support at least the side of the optic facing away from the spring.

Once the spring is in place on the mount, the central bend of the spring is then engaged (e.g., hooked, grasped, etc.) and pulled toward the stabilized base portions, deforming the spring. This opens a space forward of the contact portions of the spring sufficiently large to accommodate the optic, which is placed on the mount in front of the spring. The central bend of the spring is then released, which allows the spring to recover back toward its neutral (e.g., unstressed or undeformed) state until the contact portions contact the optic. The spring force of the spring holds the optic in place against the mount. In various embodiments, the symmetrical shape of the spring allows the force to self-balance between the two contact portions even when the spring and mount are not manufactured to their exact nominal values; thus, springs in accordance with embodiments of the present invention are able to accommodate optics and mounts of various sizes and shapes. In addition, use of springs and installation techniques in accordance with embodiments of the invention may replace or supplement the use of an adhesive used to keep the optic in place on the mechanical mount.

For example, in embodiments in which an adhesive (e.g., epoxy) is utilized, the adhesive may be applied to one or more surfaces of the optic (e.g., the bottom surface) and/or to a portion of the mount (e.g., all or a portion of the optic cradle) before the optic and spring are installed as described above. After installation of the spring, the adhesive may be cured if necessary via, e.g., application of radiation such as heat and/or ultraviolet light. Such embodiments have the advantage of redundancy—in the event of spring failure or dislodgement, the adhesive will secure the optic, while if the adhesive itself fails (due to, e.g., incomplete curing and/or insufficient cleaning of a surface to which it is applied) the spring force of the spring will keep the optic in place.

Embodiments of the invention also include tools, and kits including such tools, which facilitate the fixing of the optic on the mechanical mount with the spring. Tools in accordance with embodiments of the invention may include an engagement feature, such as a hook or grasper, configured to engage with the central bend of the spring and deform the spring to accommodate the optic, as described above. The tool may also be configured to rest against or be otherwise stabilized by the mount during deformation of the spring. The tool may include an actuation mechanism, such as a rack-and-pinion gearing system, pneumatic piston, or other linear actuator, that controls the travel of the engagement feature. The mechanism may be controlled by a manual control, such as a plunger, button, slider, or dial, on the tool. In other embodiments, the mechanism may be controlled by a computer or otherwise automated, e.g., as part of or via a robotic arm or other robot in a work cell in a manufacturing environment.

In laser systems or resonators in accordance with the invention, one or more mechanical mounts having optics fixed thereto by springs may be used to redirect or otherwise manipulate beams emitted by laser emitters. As utilized herein, the terms "front" and "back," when applied to optics and mounts, are arbitrary and not necessarily related to the direction from which laser beams are propagated onto the optic; that is, a spring may be engaged with the "front" of an optic, but that optic may receive a laser beam within a laser system from the "front" side of the optic facing the spring or the "back" side of the optic facing away from the spring.

In various embodiments, laser beams may be combined with each other within a resonator, and/or beams from individual resonators may be combined with each other, to form output beams that may be coupled into optical fibers and/or utilized for processing of a variety of different workpieces. For example, embodiments of the present invention may couple one or more laser beams into an optical fiber. In various embodiments, the optical fiber has multiple cladding layers surrounding a single core, multiple discrete core regions (or "cores") within a single cladding layer, or multiple cores surrounded by multiple cladding layers.

Resonators in accordance with embodiments of the invention may include one or more components, interfaces, and/or control systems detailed in U.S. patent application Ser. No. 15/660,134, filed on Jul. 26, 2017 (the '134 application), and/or U.S. patent application Ser. No. 16/421,728, filed on May 24, 2019, the entire disclosure of each of which is incorporated by reference herein. For example, resonator modules in accordance with embodiments of the invention may include electrical and optical interfaces that interface with complementary features on a beam-combining enclosure in which the individual beams from the modules are combined into a single output beam (and, in some embodiments, coupled into an optical fiber). The optical and electrical interfaces facilitate the easy replacement of input laser sources with a minimal amount, if any, of source alignment. The emitter modules may be insertable into and mate with input receptacles disposed in or on the enclosure in which the input beams are combined to form the output beam. Resonator modules may connect mechanically, electrically, and/or optically with one of multiple input receptacles disposed in or on (or forming portions of) the enclosure for the beam-combining optics.

Herein, "optical elements" may refer to any of lenses, mirrors, prisms, gratings, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs). Herein, it is understood that references to different "wavelengths" encompass different "ranges of wavelengths," and the wavelength (or color) of a laser corresponds to the primary wavelength thereof, that is, emitters may emit light having a finite band of wavelengths that includes (and may be centered on) the primary wavelength.

Laser systems in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention also process workpieces at one or more spots or along a one-dimensional processing path, rather than simultaneously flooding all or substantially all of the workpiece surface with radiation from the laser beam. In general, processing paths may be curvilinear or linear, and "linear" processing paths may feature one or more directional changes, i.e., linear processing paths may be composed of two or more substantially straight segments that are not necessarily parallel to each other.

Various embodiments of the invention may be utilized with laser systems featuring techniques for varying BPP of their output laser beams, such as those described in U.S. patent application Ser. No. 14/632,283, filed on Feb. 26, 2015, and U.S. patent application Ser. No. 15/188,076, filed on Jun. 21, 2016, the entire disclosure of each of which is incorporated herein by reference.

Laser systems in accordance with various embodiments of the present invention may also include a delivery mechanism that directs the laser output onto the workpiece while causing relative movement between the output and the workpiece. For example, the delivery mechanism may include, consist essentially of, or consist of a laser head for directing and/or focusing the output toward the workpiece. The laser head may itself be movable and/or rotatable relative to the workpiece, and/or the delivery mechanism may include a movable gantry or other platform for the workpiece to enable movement of the workpiece relative to the output, which may be fixed in place.

In various embodiments of the present invention, the laser beams utilized for processing of various workpieces may be delivered to the workpiece via one or more optical fibers (or "delivery fibers"). Embodiments of the invention may incorporate optical fibers having many different internal configurations and geometries. Such optical fibers may have one or more core regions and one or more cladding regions. For example, the optical fiber may include, consist essentially of, or consist of a central core region and an annular core region separated by an inner cladding layer. One or more outer cladding layers may be disposed around the annular core region. Embodiments of the invention may be utilized with and/or incorporate optical fibers having configurations described in U.S. patent application Ser. No. 15/479,745, filed on Apr. 5, 2017, U.S. patent application Ser. No. 15/879,500, filed on Jan. 25, 2018, and U.S. patent application Ser. No. 16/675,655, filed on Nov. 6, 2019, the entire disclosure of each of which is incorporated by reference herein.

Structurally, optical fibers in accordance with embodiments of the invention may include one or more layers of high and/or low refractive index beyond (i.e., outside of) an exterior cladding without altering the principles of the present invention. Various ones of these additional layers may also be termed claddings or coatings, and may not guide light. Optical fibers may also include one or more cores in addition to those specifically mentioned. Such variants are within the scope of the present invention. Various embodiments of the invention do not incorporate mode strippers in or on the optical fiber structure. Similarly, the various layers of optical fibers in accordance with embodiments of the invention are continuous along the entire length of the fiber and do not contain holes, photonic-crystal structures, breaks, gaps, or other discontinuities therein.

Optical fibers in accordance with the invention may be multi-mode fibers and therefore support multiple modes therein (e.g., more than three, more than ten, more than 20, more than 50, or more than 100 modes). In addition, optical fibers in accordance with the invention are generally passive fibers, i.e., are not doped with active dopants (e.g., erbium, ytterbium, thulium, neodymium, dysprosium, praseodymium, holmium, or other rare-earth metals) as are typically utilized for pumped fiber lasers and amplifiers. Rather, dopants utilized to select desired refractive indices in various layers of fibers in accordance with the present invention are generally passive dopants that are not excited by laser light, e.g., fluorine, titanium, germanium, and/or boron. Thus, optical fibers, and the various core and cladding layers thereof in accordance with various embodiments of the invention may include, consist essentially of, or consist of glass, such as substantially pure fused silica and/or fused silica, and may be doped with fluorine, titanium, germanium, and/or boron. Obtaining a desired refractive index for a particular layer or region of an optical fiber in accordance with embodiments of the invention may be accomplished (by techniques such as doping) by one of skill in the art without undue experimentation. Relatedly, optical fibers in accordance with embodiments of the invention may not incorporate reflectors or partial reflectors (e.g., grating such as Bragg gratings) therein or thereon. Fibers in accordance with embodiments of the invention are typically not pumped with pump light configured to generate laser light of a different wavelength. Rather, fibers in accordance with embodiments of the invention merely propagate light along their lengths without changing its wavelength. Optical fibers utilized in various embodiments of the invention may feature an optional external polymeric protective coating or sheath disposed around the more fragile glass or fused silica fiber itself.

In addition, systems and techniques in accordance with embodiments of the present invention are typically utilized for materials processing (e.g., cutting, drilling, etc.), rather than for applications such as optical communication or optical data transmission. Thus, laser beams, which may be coupled into fibers in accordance with embodiments of the invention, may have wavelengths different from the 1.3 µm or 1.5 µm utilized for optical communication. In fact, fibers utilized in accordance with embodiments of the present invention may exhibit dispersion at one or more (or even all) wavelengths in the range of approximately 1260 nm to approximately 1675 nm utilized for optical communication.

In an aspect, embodiments of the invention feature a spring including, consisting essentially of, or consisting of a single length of elastic material having first and second ends. The length of elastic material comprises, consists essentially of, consists of, and/or defines (i) first and second off-center bends providing a pair of substantially collinear base portions with the opposed ends facing each other, and (ii) a third central, generally U-shaped bend defining first and second contact portions opposed to each other across the third bend to thereby resist compression of the first and second contact portions toward the base portions.

Embodiments of the invention may include one or more of the following in any of a variety of combinations. One or both of the first and second contact portions may be opposed to and bowed away from one of the base portions. The first and second ends may be spaced apart from each other. The length of elastic material may include (i) a first linear segment disposed between the first off-center bend and the first contact portion and/or (ii) a second linear segment disposed between the second off-center bend and the second contact portion. The elastic material may include, consist essentially of, or consist of a metal or a metal alloy. A radius of the third bend may be less than a radius of the first off-center bend and/or less than a radius of the second off-center bend. A width of the spring between the first and second off-center bends may be greater than a depth of the spring between the contact points and the base portions. A distance between the first and second contact portions may range from approximately 40% to approximately 75%, or from approximately 40% to approximately 60%, of a width of the spring between the first and second off-center bends. The spring may be symmetric across a mirror plane bisecting the third central, generally U-shaped bend.

In another aspect, embodiments of the invention feature an optical assembly that includes, consists essentially of, or consists of a mechanical mount, an optic, and a spring. The mechanical mount includes, in or on a top surface thereof, (i) an optic cradle configured to receive the optic therein, and (ii) a spring cradle configured to receive the spring therein. The optic is received in the optic cradle, and the spring is received in the spring cradle. The spring has (i) first and second contact points contacting the optic and (ii) first and second base portions, opposite the first and second contact points, contacting a portion of the spring cradle, whereby spring force exerted by the spring fixes the optic in place in the optic cradle.

Embodiments of the invention may include one or more of the following in any of a variety of combinations. The spring may include, consist essentially of, or consist of a single length of elastic material having first and second ends. The length of elastic material may include, consist essentially of, consist of, and/or define (i) first and second off-center bends providing the first and second base portions, and (ii) a third central, generally U-shaped bend defining the first and second contact portions, the first and second contact portions being opposed to each other across the third bend to thereby resist compression of the first and second contact portions toward the first and second base portions. The first and second base portions may be substantially collinear, and/or the first and second ends of the length of elastic material may face each other. One or both of the first and second contact portions may be opposed to and bowed away from one of the first and second base portions. The first and second ends may be spaced apart from each other. The length of elastic material may include (i) a first linear segment disposed between the first off-center bend and the first contact portion and/or (ii) a second linear segment disposed between the second off-center bend and the second contact portion. A radius of the third bend may be less than a radius of the first off-center bend and/or less than a radius of the second off-center bend. A width of the spring between the first and second off-center bends may be greater than a depth of the spring between the contact points and the base portions. A distance between the first and second contact portions may range from approximately 40% to approximately 75%, or from approximately 40% to approximately 60%, of a width of the spring between the first and second off-center bends. The spring may be symmetric across a mirror plane bisecting the third central, generally U-shaped bend. The spring may include, consist essentially of, or consist of a metal or a metal alloy. The optic may include, consist essentially of, or consist of a reflector, a polarizer, a waveplate, a diffuser, a lens, or a diffraction grating. The mechanical mount may define therethrough one or more mounting holes.

In yet another aspect, embodiments of the invention feature a tool for fixing an optic in place on a mechanical mount using a spring having (i) first and second contact points, (ii) a central bend between the first and second contact points, and (iii) first and second base portions opposite the first and second contact points. The tool includes, consists essentially of, or consists of (i) a body having a first end and a second end opposite the first end, (ii) extending from the first end of the body, an engagement mechanism for engaging the central bend of the spring, (iii) an actuator for controlling motion of the engagement mechanism, and (iv) a control mechanism mechanically coupling the actuator and the engagement mechanism.

Embodiments of the invention may include one or more of the following in any of a variety of combinations. The control mechanism may be at least partially disposed within the body. The control mechanism may include, consist essentially of, or consist of a rack-and-pinion gearing system. The engagement mechanism may include, consist essentially of, or consist of a hook or a grasper. The actuator may include, consist essentially of, or consist of a button or a plunger. The tool may include, disposed on the first end of the body, a stabilizer configured to engage with (e.g., contact) a front surface of the mount when the engagement mechanism is positioned to engage with the central bend of the spring. The control mechanism may be configured to retract the engagement mechanism toward the second end of the body when the actuator is pressed or actuated or activated. The tool may include first and second opposed projections, extending from a lateral portion of the tool between the first and second ends, configured to receive one or more fingers of a user. The spring may include, consist essentially of, or consist of a single length of elastic material having first and second ends. The length of elastic material may include, consist essentially of, consist of, and/or define first and second off-center bends providing the first and second base portions. The central bend may be generally U-shaped and may define the first and second contact portions. The first and second contact portions may be opposed to each other across the central bend to thereby resist compression of the first and second contact portions toward the first and second base portions.

In another aspect, embodiments of the invention feature a kit for fixing an optic in place on a mechanical mount. The kit includes, consists essentially of, or consists of a spring and a tool. The spring has (i) first and second contact points, (ii) a central bend between the first and second contact points, and (iii) first and second base portions opposite the first and second contact points. The tool includes, consists essentially of, or consists of a body, an engagement mechanism, an actuator, and a control mechanism. The body has a first end and a second end opposite the first end. The engagement engages the central bend of the spring and extends from the first end of the body. The actuator controls motion of the engagement mechanism. The control mechanism mechanically couples the actuator and the engagement mechanism.

Embodiments of the invention may include one or more of the following in any of a variety of combinations. The control mechanism may be partially or fully disposed within the body. The control mechanism may include, consist essentially of, or consist of a rack-and-pinion gearing system. The engagement mechanism may include, consist essentially of, or consist of a hook or a grasper. The actuator may include, consist essentially of, or consist of a button or a plunger. The tool may include, disposed on the first end of the body, a stabilizer configured to engage with a front surface of the mount when the engagement mechanism is positioned to engage with the central bend of the spring. The control mechanism may be configured to retract the engagement mechanism toward the second end of the body when the actuator is pressed. The tool may include first and second opposed projections, extending from a lateral portion of the tool between the first and second ends, configured to receive one or more fingers of a user.

The spring may include, consist essentially of, or consist of a single length of elastic material having first and second ends. The length of elastic material may include first and second off-center bends providing the first and second base portions. The central bend may be generally U-shaped and may define the first and second contact portions. The first and second contact portions may be opposed to each other across the central bend to thereby resist compression of the first and second contact portions toward the first and second base portions. The first and second base portions may be substantially collinear, and/or the first and second ends of the length of elastic material may face each other. Each of first and second contact portions may be opposed to and bowed away from one of the first and second base portions. The first and second ends may be spaced apart from each other. The length of elastic material may include (i) a first linear segment disposed between the first off-center bend and the first contact portion and/or (ii) a second linear segment disposed between the second off-center bend and the second contact portion. A radius of the central bend may be less than a radius of the first off-center bend and/or less than a radius of the second off-center bend. A width of the spring between the first and second off-center bends may be greater than a depth of the spring between the contact points and the base portions. A distance between the first and second contact portions may range from approximately 40% to approximately 75%, or from approximately 40% to approximately 60%, of a width of the spring between the first and second off-center bends. The spring may include, consist essentially of, or consist of a metal or a metal alloy.

In yet another aspect, embodiments of the invention feature a kit for situating an optic in a laser system. The kit includes, consists essentially of, or consists of an optic, a mechanical mount, a spring, and a tool. The mechanical mount includes or defines, in or on a top surface thereof, (i) an optic cradle configured to receive the optic therein, and (ii) a spring cradle configured to receive a spring therein. The spring has (i) first and second contact points configured to contact the optic, (ii) a central bend between the first and second contact points, and (iii) first and second base portions, opposite the first and second contact points, configured to contact a portion of the spring cradle. When the optic is received in the optic cradle and the spring is received in the spring cradle, spring force exerted by the spring fixes the optic in place in the optic cradle. The tool includes, consists essentially of, or consists of a body, an engagement mechanism, an actuator, and a control mechanism. The body has a first end and a second end opposite the first end. The engagement engages the central bend of the spring and extends from the first end of the body. The actuator controls motion of the engagement mechanism. The control mechanism mechanically couples the actuator and the engagement mechanism.

Embodiments of the invention may include one or more of the following in any of a variety of combinations. The control mechanism may be partially or fully disposed within the body. The control mechanism may include, consist essentially of, or consist of a rack-and-pinion gearing system. The engagement mechanism may include, consist essentially of, or consist of a hook or a grasper. The actuator may include, consist essentially of, or consist of a button or a plunger. The tool may include, disposed on the first end of the body, a stabilizer configured to engage with a front surface of the mount when the engagement mechanism is positioned to engage with the central bend of the spring. The control mechanism may be configured to retract the engagement mechanism toward the second end of the body when the actuator is pressed. The tool may include first and second opposed projections, extending from a lateral portion of the tool between the first and second ends, configured to receive one or more fingers of a user.

The spring may include, consist essentially of, or consist of a single length of elastic material having first and second ends. The length of elastic material may include first and second off-center bends providing the first and second base portions. The central bend may be generally U-shaped and may define the first and second contact portions. The first and second contact portions may be opposed to each other across the central bend to thereby resist compression of the first and second contact portions toward the first and second base portions. The first and second base portions may be substantially collinear, and/or the first and second ends of the length of elastic material may face each other. Each of first and second contact portions may be opposed to and bowed away from one of the first and second base portions. The first and second ends may be spaced apart from each other. The length of elastic material may include (i) a first linear segment disposed between the first off-center bend and the first contact portion and/or (ii) a second linear segment disposed between the second off-center bend and the second contact portion. A radius of the central bend may be less than a radius of the first off-center bend and/or less than a radius of the second off-center bend. A width of the spring between the first and second off-center bends may be greater than a depth of the spring between the contact points and the base portions. A distance between the first and second contact portions may range from approximately 40% to approximately 75%, or from approximately 40% to approximately 60%, of a width of the spring between the first and second off-center bends. The spring may include, consist essentially of, or consist of a metal or a metal alloy. The optic may include, consist essentially of, or consist of a reflector, a polarizer, a waveplate, a diffuser, a lens, or a diffraction grating. The mechanical mount may define therethrough one or more mounting holes.

In another aspect, embodiments of the invention feature a method of situating an optic in a laser system. A mechanical mount is provided. The mechanical mount includes or defines, in or on a top surface thereof, (i) an optic cradle configured to receive an optic therein, and (ii) a spring cradle configured to receive a spring therein. A spring is provided. The spring has (i) first and second contact points, and (ii) first and second base portions opposite the first and second contact points. The spring is placed within the spring cradle such that the first and second contact points face toward the optic cradle. The spring is deformed to draw the first and second contact points toward the first and second base portions. The optic is placed within the optic cradle. Thereafter, the spring is allowed to recover toward its original conformation until the first and second contact points contact the optic, remnant spring force in the spring fixing the optic in place in the optic cradle.

Embodiments of the invention may include one or more of the following in any of a variety of combinations. The remnant spring force in the spring may fix the optic in place in the optic cradle without another fixation means (e.g., adhesive, one or more clamps, etc.) fixing the optic in place. The spring may include a central bend between the first and second contact points. Deforming the spring may include, consist essentially of, or consist of engaging the central bend and pulling the central bend toward the first and second base portions. Engaging the central bend may include, consist essentially of, or consist of hooking or grasping the central bend. The spring may include, consist essentially of, or consist of a single length of elastic material having first and second ends. The length of elastic material may include first and second off-center bends providing the first and second base portions. The central bend may be generally U-shaped and may define the first and second contact portions. The first and second contact portions may be opposed to each other across the central bend to thereby resist compression of the first and second contact portions toward the first and second base portions.

In yet another aspect, embodiments of the invention feature a laser resonator that includes, consists essentially of, or consists of (i) a base plate having a first side and a second side opposite the first side and defining an opening therethrough, (ii) a plurality of beam emitters disposed on the first side of the base plate, (iii) a first optical cavity, disposed on the first side of the base plate, for manipulation of the beams emitted by the beam emitters, and (iv) a second optical cavity disposed on the second side of the base plate. Each beam emitter is configured to emit one or more beams (e.g., laser beams). A first optical assembly is disposed within the first optical cavity. The first optical assembly includes, consists essentially of, or consists of (a) a first mechanical mount including or defining, in or on a top surface thereof, (i) a first optic cradle configured to receive a first optic therein, and (ii) a first spring cradle configured to receive a first spring therein, (b) the first optic received within the first optic cradle, and (c) the first spring received within the first spring cradle. The first spring has (i) first and second contact points contacting the first optic and (ii) first and second base portions, opposite the first and second contact points, contacting a portion of the first spring cradle, whereby spring force exerted by the first spring fixes the first optic in place in the first optic cradle. The second optical cavity includes, consists essentially of, or consists of a plurality of second optical elements configured to receive beams from the first optical cavity through the opening in the base plate, combine the beams into a combined beam, transmit a first portion of the combined beam from the laser resonator as an output beam, and transmit a second portion of the combined beam back through the opening to the beam emitters.

Embodiments of the invention may include one or more of the following in any of a variety of combinations. The first optic may include, consist essentially of, or consist of a lens, a collimation lens, a slow-axis collimation lens, a fast-axis collimation lens, a reflector, an interleaver mirror, or a folding mirror. The plurality of second optical elements may include, consist essentially of, or consist of a dispersive element (e.g., a diffraction grating with or without a prism) and a partially reflective output coupler. The plurality of second optical elements may include one or more folding mirrors. The laser resonator may include a beam output for outputting the output beam. The beam output may include, consist essentially of, or consist of a window and/or a coupler configured to connect to an optical fiber. The laser resonator may include a second optical assembly disposed in the second optical cavity. The second optical assembly may include, consist essentially of, or consist of (a) a second mechanical mount including or defining, in or on a top surface thereof, (i) a second optic cradle configured to receive one of the second optical elements therein, and (ii) a second spring cradle configured to receive a second spring therein, (b) said second optical element received within the second optic cradle, and (c) the second spring received within the second spring cradle. The second spring may have (i) first and second contact points contacting the said second optical element and (ii) first and second base portions, opposite the first and second contact points, contacting a portion of the second spring cradle, whereby spring force exerted by the second spring fixes the said second optical element in place in the second optic cradle.

The first spring may include, consist essentially of, or consist of a single length of elastic material having first and second ends. The length of elastic material may include, consist essentially of, or consist of (i) first and second off-center bends providing the first and second base portions, and (ii) a third central, generally U-shaped bend defining the first and second contact portions, the first and second contact portions being opposed to each other across the third bend to thereby resist compression of the first and second contact portions toward the first and second base portions. The first and second base portions may be substantially collinear, and/or the first and second ends of the length of elastic material may face each other. Each of first and second contact portions may be opposed to and bowed away from one of the first and second base portions. The first and second ends may be spaced apart from each other. The length of elastic material may include (i) a first linear segment disposed between the first off-center bend and the first contact portion and/or (ii) a second linear segment disposed between the second off-center bend and the second contact portion. A radius of the central bend may be less than a radius of the first off-center bend and/or less than a radius of the second off-center bend. A width of the first spring between the first and second off-center bends may be greater than a depth of the first spring between the contact points and the base portions. A distance between the first and second contact portions may range from approximately 40% to approximately 75%, or from approximately 40% to approximately 60%, of a width of the spring between the first and second off-center bends. The first spring may include, consist essentially of, or consist of a metal or a metal alloy.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. Distances utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

The present disclosure will generally utilize WBC resonators as examples of laser systems usable in accordance with embodiments of the present invention. While exemplary embodiments include WBC resonators, embodiments of the invention may also be utilized with other types of laser systems utilizing one or more beam emitters in conjunction with one or more optics mounted on mechanical mounts and fixed thereto with springs. Embodiments of the invention may even include free-standing mechanical mounts with optics affixed thereto with springs, for example, in a free-space laser system.

Figure 1:
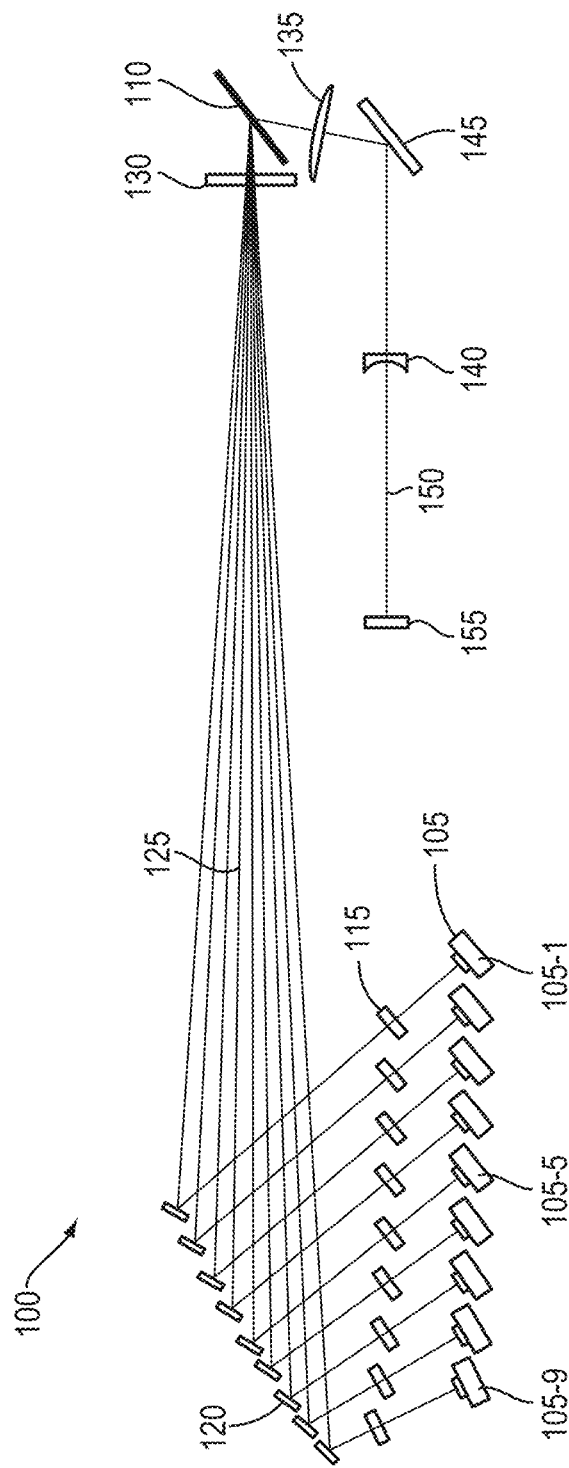
FIG. 1 is a schematic diagram of a laser resonator in accordance with embodiments of the present invention.

FIG. 1 schematically depicts various components of an exemplary WBC resonator 100 that may incorporate embodiments of the present invention. In the depicted embodiment, resonator 100 combines the beams emitted by nine different diode bars (as utilized herein, "diode bar" refers to any multi-beam emitter, i.e., an emitter from which multiple beams are emitted from a single package). Embodiments of the invention may be utilized with fewer or more than nine emitters. In accordance with embodiments of the invention, each emitter may emit a single beam, or, each of the emitters may emit multiple beams. The view of FIG. 1 is along the WBC dimension, i.e., the dimension in which the beams from the bars are combined. The exemplary resonator 100 features nine diode bars 105, and each diode bar 105 includes, consists essentially of, or consists of an array (e.g., one-dimensional array) of emitters along the WBC dimension. In various embodiments, each emitter of a diode bar 105 emits a non-symmetrical beam having a larger divergence in one direction (known as the "fast axis," here oriented vertically relative to the WBC dimension) and a smaller divergence in the perpendicular direction (known as the "slow axis," here along the WBC dimension).

In various embodiments, each of the diode bars 105 is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. The microlens assembly also converges the chief rays of the emitters from each diode bar 105 toward a dispersive element 110. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

In embodiments of the invention in which both a FAC lens and an optical twister (e.g., as a microlens assembly) are associated with each of the beam emitters and/or emitted beams, and SAC lenses (as detailed below) affect the beams in the non-WBC dimension. In other embodiments, the emitted beams are not rotated, and FAC lenses may be utilized to alter pointing angles in the non-WBC dimension. Thus, it is understood that references to SAC lenses herein generally refer to lenses having power in the non-WBC dimension, and such lenses may include FAC lenses in various embodiments. Thus, in various embodiments, for example embodiments in which emitted beams are not rotated and/or the fast axes of the beams are in the non-WBC dimension, FAC lenses may be utilized as detailed herein for SAC lenses.

As shown in FIG. 1, resonator 100 also features a set of SAC lenses 115, one SAC lens 115 associated with, and receiving beams from, one of the diode bars 105. Each of the SAC lenses 115 collimates the slow axes of the beams emitted from a single diode bar 105. After collimation in the slow axis by the SAC lenses 115, the beams propagate to a set of interleaving mirrors 120, which redirect the beams 125 toward the dispersive element 110. The arrangement of the interleaving mirrors 120 enables the free space between the diode bars 105 to be reduced or minimized. Upstream of the dispersive element 110 (which may include, consist essentially of, or consist of, for example, a diffraction grating such as the transmissive diffraction grating depicted in FIG. 1, or a reflective diffraction grating), a lens 130 may optionally be utilized to collimate the sub-beams (i.e., emitted rays other than the chief rays) from the diode bars 105. In various embodiments, the lens 130 is disposed at an optical distance away from the diode bars 105 that is substantially equal to the focal length of the lens 130. Note that, in typical embodiments, the overlap of the chief rays at the dispersive element 110 is primarily due to the redirection of the interleaving mirrors 120, rather than the focusing power of the lens 130.

Also depicted in FIG. 1 are lenses 135, 140, which form an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosure of which is hereby incorporated by reference herein. Resonator 100 may also include one or more optional folding mirrors 145 for redirection of the beams such that the resonator 100 may fit within a smaller physical footprint. The dispersive element 110 combines the beams from the diode bars 105 into a single, multi-wavelength beam 150, which propagates to a partially reflective output coupler 155. The coupler 155 transmits a portion of the beam as the output beam of resonator 100 while reflecting another portion of the beam back to the dispersive element 110 and thence to the diode bars 105 as feedback to stabilize the emission wavelengths of each of the beams.

In various embodiments of the invention, any or all of the optical elements (e.g., lenses, reflectors, couplers, gratings, polarizers, waveplates, dichroic combiners, etc.) of the system or resonator may be fixed to mechanical mounts via springs as described herein (e.g., with or without additional adhesive). In various embodiments, each optical element may be fixed to a separate mechanical mount. In other embodiments, two or more optical elements may be fixed on different portions of a shared mechanical mount, each with its own spring. Additional examples are described below and shown in subsequent figures.

Figure 11:
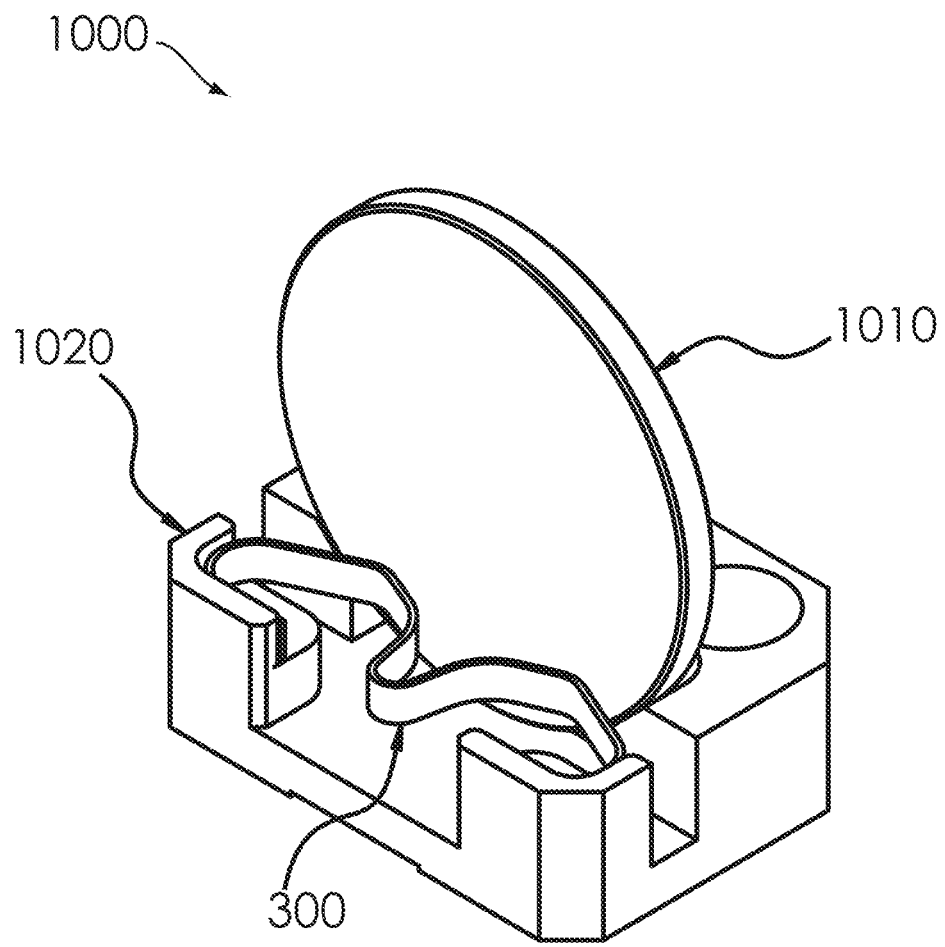

Springs in accordance with embodiments of the present invention may not be utilized with all optical elements, or all optical elements within a particular laser system or resonator (e.g., the resonator of FIG. 1). For example, springs in accordance with embodiments of the invention may not be utilized with optical elements having widths smaller than approximately 20 mm, as space constraints may make spring placement difficult. Moreover, springs in accordance with embodiments of the invention may not be utilized, in various implementations, with optical elements having curvature (e.g., having front and back surfaces that are not perpendicular to the mount surface and/or not parallel to each other), and/or with round optical elements, as other mechanical mounting means and techniques may be more suitable to such optical elements. However, as shown in FIG. 11, in various embodiments the springs may be utilized with round optical elements. In addition, springs in accordance with embodiments of the invention may not be utilized with diffraction gratings (or other dispersive and/or transmissive optical elements), in order to prevent birefringence resulting from the application of spring force; in these embodiments, such optical elements may be mounted utilizing, for example, an adhesive such as epoxy, and other optical elements (e.g., reflective optical elements) may be mounted using springs as detailed herein.

Figure 2A:
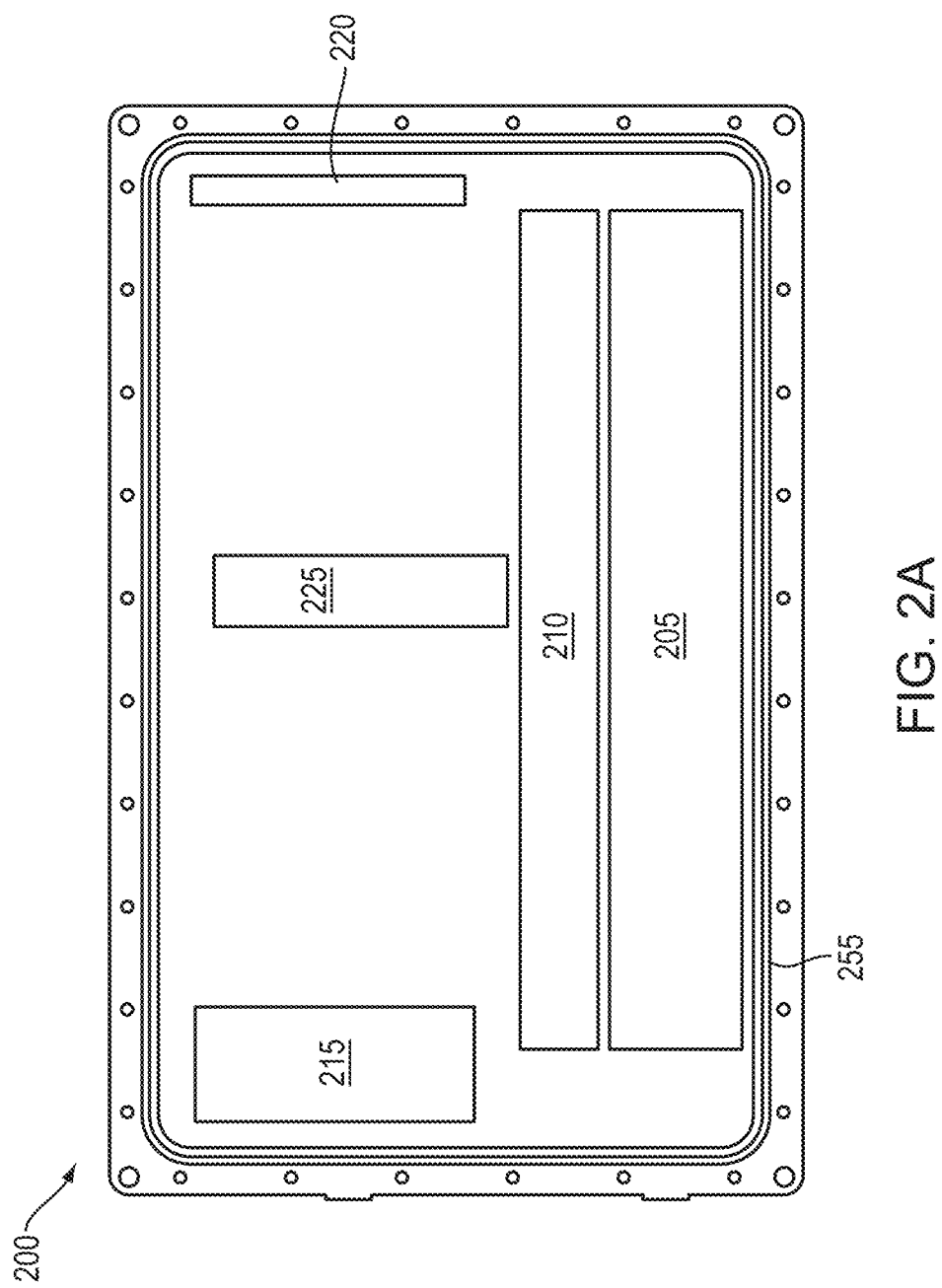
FIG. 2A is a schematic view of a first side of a laser resonator in accordance with various embodiments of the present invention.
Figure 2B:
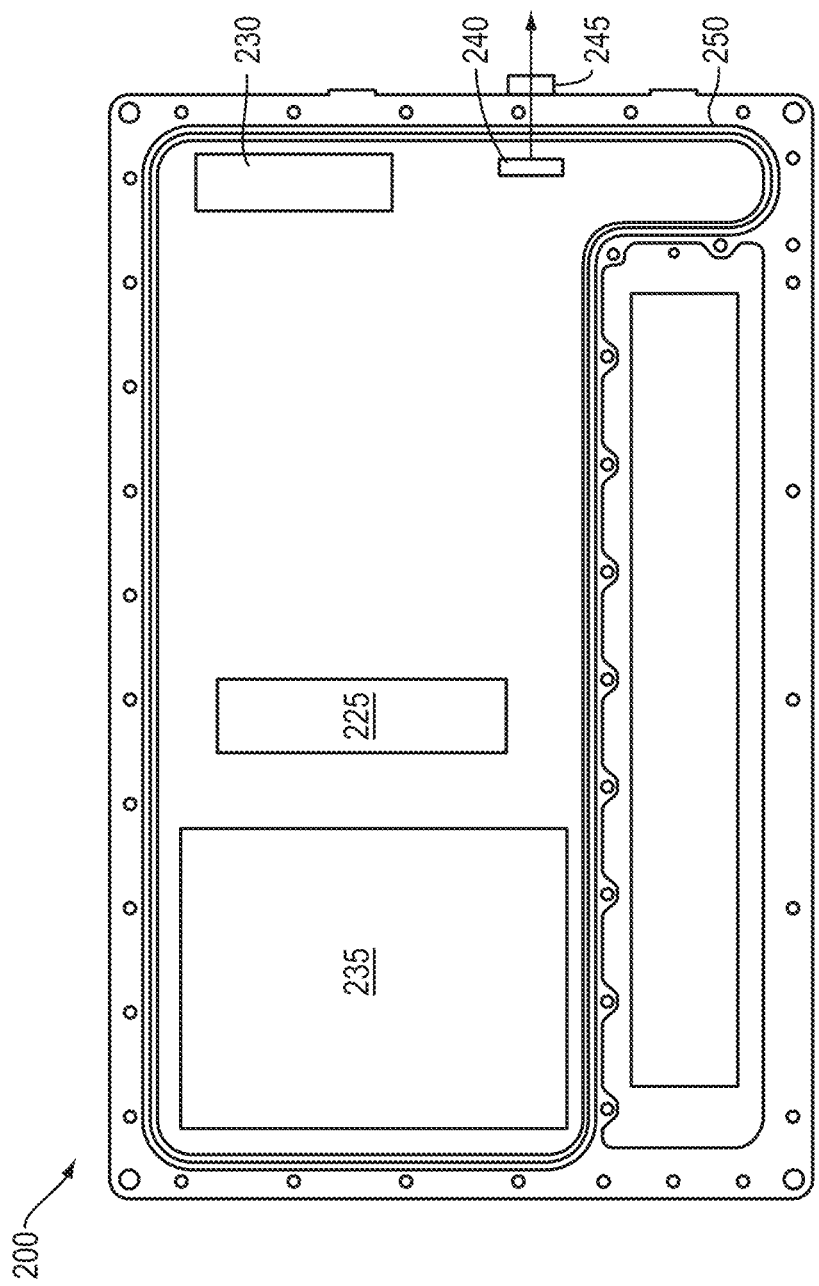
FIG. 2B is a schematic view of a second side of a laser resonator in accordance with various embodiments of the present invention.

Various embodiments of the invention include laser resonators with external lasing cavities, as described in accordance with FIG. 1, and reduce the required size of the resonator by utilizing opposing sides of the resonator to form a larger optical cavity. Reflectors such as mirrors may be utilized to direct the beams within the optical cavity, and, since the optical cavity extends along both sides of the resonator, the overall size of the resonator may be correspondingly reduced for the same cavity size (e.g., compared to a resonator having an optical cavity on only one side). For example, FIGS. 2A and 2B are simplified schematic diagrams of opposite sides of a laser resonator 200 in which areas for various components of the resonator 200 may be mounted, for example on a central mounting platform. In the exemplary resonator 200, beams from beam emitters mounted in a mounting area 205 may be focused by a group of lenses (and/or other optical elements; e.g., SAC lenses 115) disposed in a lens area 210 toward a group of mirrors (e.g., interleaving mirrors 120) in a mirror area 215. From mirror area 215, the beams from the beam emitters may be directed to another mirror area 220 (containing multiple reflectors such as mirrors, e.g., folding mirrors) and thence through an opening 225 to the opposite side of resonator 200 depicted in FIG. 2B. In FIG. 2B, the beams may be directed to a mirror area 230 (containing multiple reflectors such as mirrors, e.g., folding mirrors), which reflects the beams to a beam-combining area 235. In example embodiments, the beam-combining area 235 may include therewithin a diffusive element such as a diffraction grating (and, in some embodiments, an output coupler), as described in relation to FIG. 1. In various embodiments, the beams each have a different wavelength, and the beams are combined in beam-combining area 235 into an output beam composed of the multiple wavelengths. The beam from the beam-combining area 235 may be directed to a mirror 240 (which, in various embodiments, may be the partially reflective output coupler described in relation to FIG. 1) and thence to an output 245 for emission from the resonator 200. For example, the output 245 may be a window for emission of the beam therethrough or an optical coupler configured to connect to an optical fiber.

FIGS. 2A and 2B also depict sealing paths 250, 255. In various embodiments, cover plates may be mounted over one or both sides of the resonator 200 in order to cover and protect the internal cavities and the components therewithin. For example, the cover plates may be sealed to the resonator 200 via o-rings or other seals, and the cover plates may be attached to the resonator with one or more fasteners (screws, bolts, rivets, etc.) or an adhesive material, and/or via a technique such as welding or brazing.

In accordance with embodiments of the present invention, individual optics are fixed to mechanical mounts by springs. In various embodiments, the mechanical mounts themselves may themselves be fixed to one or more platforms (or "optical substrates") within the laser system (e.g., on a common resonator platform, as shown in FIGS. 2A and 2B), or the mounts may be portions of the platform itself, for example, the mounts may be features machined or otherwise shaped as portions of the platform during fabrication thereof. In accordance with embodiments of the invention, the material of the mechanical mount is not particularly limited. In general, the mechanical mount includes, consists essentially of, or consists of one or more rigid materials capable of supporting an optic. For example, the mechanical mount may include, consist essentially of, or consist of one or more metals such as aluminum, an aluminum alloy, or stainless steel, and/or an engineering plastic such as polyetherimide (PEI), polyaryletherketone (PEEK), or polybutylene terephthalate (PBT). In various embodiments, two or more of the platform, the mechanical mount, and the spring include, consist essentially of, or consist of different materials, while in other embodiments, two or more of the platform, the mechanical mount, and the spring include, consist essentially of, or consist of the same material. In various embodiments, the spring and the mechanical mount have coefficients of thermal expansion that are substantially matched (e.g., ±25%, ±10%, or ±5% of each other). In other embodiments, the spring and the mechanical mount include, consist essentially of, or consist of different materials and/or have dissimilar coefficients of thermal expansion (e.g., 2-5× different from each other). For example, in various embodiments the spring may include, consist essentially of, or consist of stainless steel, and the mechanical mount may include, consist essentially of, or consist of aluminum or an aluminum alloy. In various embodiments, the platform and the mechanical mount have coefficients of thermal expansion that are substantially matched (e.g., ±25%, +10%, or ±5% of each other).

Figure 3A:
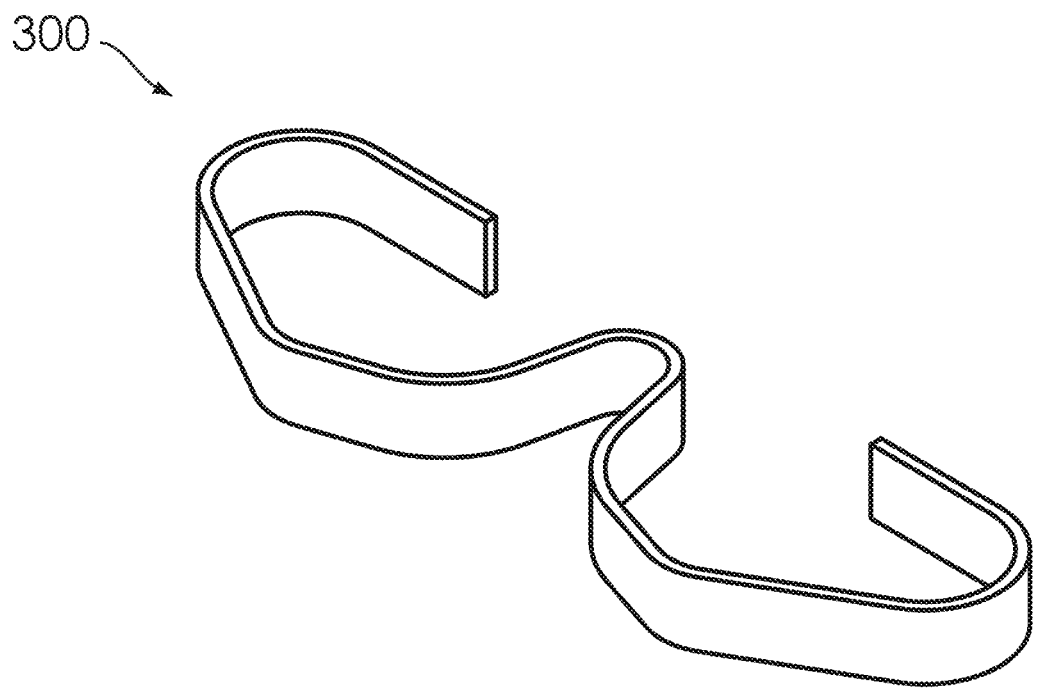
FIGS. 3A and 3B are, respectively, a schematic perspective view and a schematic plan view of an exemplary spring in accordance with various embodiments of the invention.
Figure 3B:
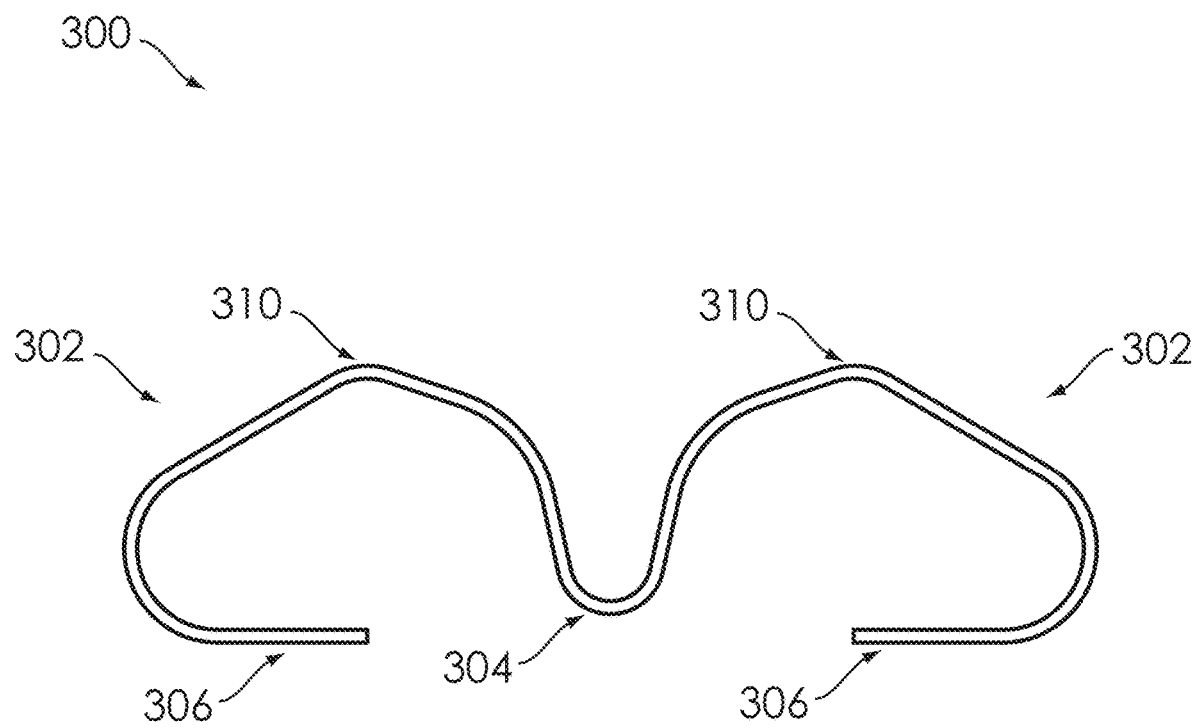

FIGS. 3A and 3B depict an exemplary spring 300 in accordance with embodiments of the invention. As shown, the spring 300 includes, consists essentially of, or consists of a single length of an elastic material having first and second opposing ends. The spring 300 has or defines two off-center bends 302 as well as a central, generally U-shaped bend 304 between the off-center bends 302. The off-center bends 302 define a pair of substantially collinear base portions 306 in which the opposing ends of the spring 300 face each other. The central bend 304 connects the off-center bends 302 together and defines two contact portions 310 opposed to each other across (and separated by) the central bend 304. In various embodiments, the spring 300 is symmetric across a mirror plane bisecting the central U-shaped bend 304. In various embodiments, each of the contact portions 310 is opposed to and bowed away from one of the base portions 306. In various embodiments, the ends of the elastic material (in the base portions 306) may be spaced apart from each other, as shown in FIGS. 3A and 3B. In various embodiments, a portion of a base portion 306, or even the corresponding end of the spring 300, may be located directly opposite the contact portion 310 (e.g., from a center point thereof). That is, an imaginary line, drawn parallel to the mirror plane bisecting the spring 300 through the central bend 304, may intersect the center point of a contact portion 310 and the corresponding end of the spring 300 on that side of the central bend 304 (see, e.g., FIG. 3C). In various embodiments, the contact portions 310 may curve or bend such that they each contact the optic substantially at a single point, as shown in FIGS. 3A and 3B. In other embodiments, the contact portions 310 themselves may be substantially linear portions of the elastic material such that contact is made with the optic, at each contact portion 310, along a desired length of the material.

Figure 3C:
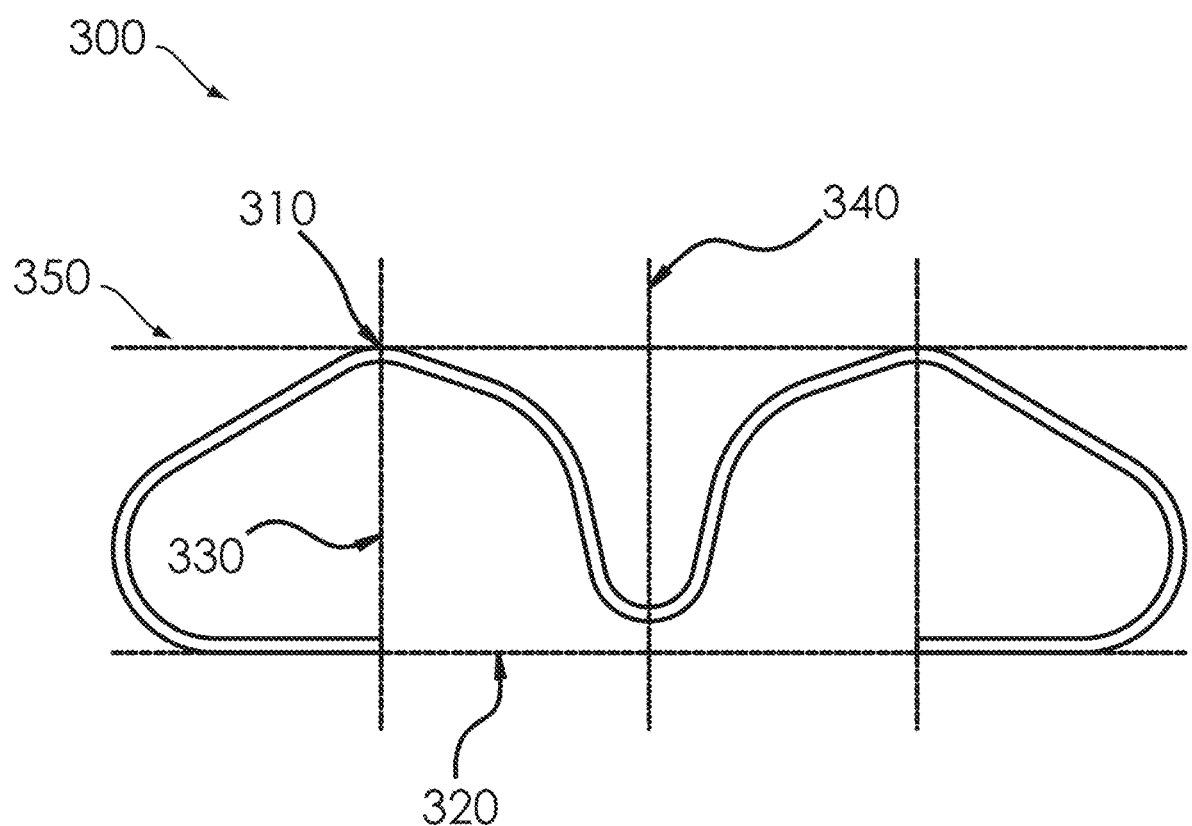
FIG. 3C is the schematic plan view of the exemplary spring of FIG. 3B, with various features labelled in accordance with various embodiments of the invention.

As shown in FIGS. 3A and 3B, on each side of the spring 300 there may be a substantially linear length of the material between the contact point 310 and the portion that curves to form the linear base portion 306. In other embodiments, the entirety of the portion of the spring 300, on either side, between the contact point 310 and the linear base portion 306 may be curved. As shown in FIG. 3C, in various embodiments, the linear base portions 306 are collinear (e.g., along an imaginary line 320). As also shown, the distance between one of the contact points 310 and its corresponding base portion 306 (e.g., along an imaginary line 330 parallel to the plane of mirror symmetry 340 bisecting the central bend 304) is greater than or approximately equal to the distance from the center of the central bend 304 and the "front" of the spring, i.e., the imaginary line 350 connecting the two contact points 310. In other embodiments, the central bend 304 protrudes behind the "back" of the spring defined by the collinear base portions 306, even in the rest/undeformed position.

In various embodiments, the spring 300 includes, consists essentially of, or consists of one or more elastic materials, i.e., materials that can undergo at least limited amounts of recoverable deformation (i.e., deformation without permanent shape change or plastic yield of the material). For example, the spring 300 may include, consist essentially of, or consist of one or more metallic materials such as music wire, steel (e.g., oil-tempered high carbon steel), stainless steel, phosphor bronze, beryllium copper, or Inconel (i.e., an alloy including, consisting essentially of, or consisting of a nickel, chromium, and iron).

Figure 3D:
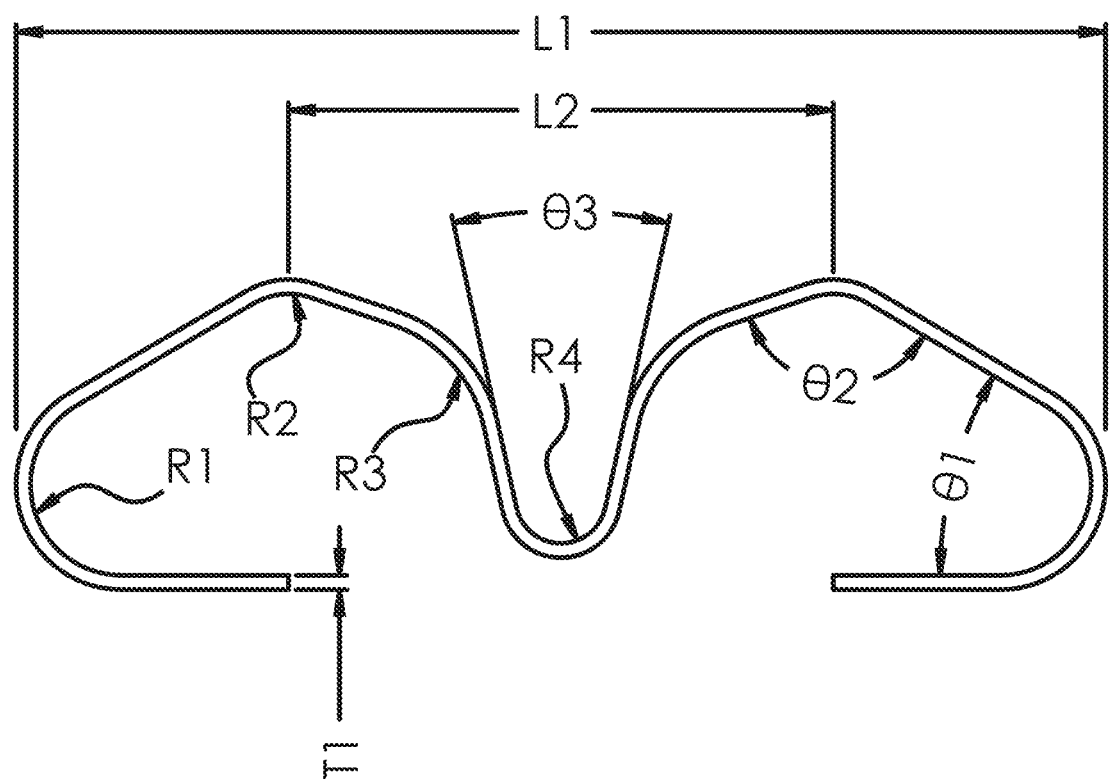
FIG. 3D is the schematic plan view of the exemplary spring of FIG. 3B, with various features labelled in accordance with various embodiments of the invention.

FIG. 3D reproduces the top view of the spring 300 of FIG. 3B and indicates several of the dimensions or features of the spring 300 that may be varied in accordance with embodiments of the present invention in order to, e.g., achieve a desired spring constant and spring force for fixing the optic to the mechanical mount. As shown, such features that may be varied include:

T1, the thickness of the spring material;
L1, the overall width of the spring;
L2, the width of the spring between the contact points;

θ1, the angle between the base portion and the segment between the contact point and the base portion;

θ2, the angle between segments of the spring on either side of a contact point;

θ3, the angle between segments meeting at the central U-shaped bend;

R1, the radius of the off-center bend;

R2, the radius of the contact point;

R3, the radius of the bend between the central bend and the contact point;

R4, the radius of the central bend; and

H (not shown), the height of the spring (i.e., out of the plane of the page of FIG. 3D; visible in FIG. 3A).

In general, the variables detailed above may be varied in accordance with the demands of the specific application, e.g., to achieve a particular spring force, spring constant, and/or spring deformation for use with a particular optic and/or mount geometry. Also, note that L1 and L2 are straight-line widths across the spring (e.g., between various points on the spring) rather than, for example, sinuous lengths measured along the spring itself. Exemplary ranges of values of the variables are provided below, but it should be emphasized that these values are only examples and are not limiting to the scope of embodiments of the present invention. In exemplary embodiments, H may range from approximately 1 mm to approximately 5 mm, T1 may range from approximately 0.1 mm to approximately 2 mm, L1 may range from approximately 10 mm to approximately 100 mm, L2 may range from approximately 5 mm to approximately 50 mm, θ1 may range from approximately 200 to approximately 450 (or from approximately 20° to approximately 35°), θ2 may range from approximately 90° to approximately 135° (or from approximately 110° to approximately 135°), θ3 may range from approximately 10° to approximately 85° (or from approximately 10° to approximately 45°, or from approximately 10° to approximately 30°), R1 may range from approximately 1 mm to approximately 10 mm (or from approximately 1 mm to approximately 5 mm), R2 may range from approximately 1 mm to approximately 10 mm (or from approximately 1 mm to approximately 5 mm), R3 may range from approximately 1 mm to approximately 10 mm (or from approximately 1 mm to approximately 5 mm), and R4 may range from approximately 0.5 mm to approximately 5 mm (or from approximately 0.5 mm to approximately 2 mm). In general, θ3 and R4 are sufficiently large to facilitate engagement (e.g., hooking or grasping) of the central bend during installation of an optic on a mechanical mount, while also be sufficiently small to enable the spring to have a compact size (e.g., width, depth, and/or height) capable of fitting within a variety of different mounts.

As previously mentioned, various ones of these variables may be increased or decreased (even to values outside of the above example ranges) for different spring materials and/or for different applications, in order to achieve desired spring forces and/or spring constants. One of skill in the art may, without undue experimentation, select values of these variables for a given spring material and its material properties (e.g., Young's modulus, etc.) to achieve a spring that provides the desired spring force for an elastic deformation sufficient to accommodate (and securely hold) an optic of a particular size and shape. For example, the height H of the spring may be increased to increase the spring force while keeping the other geometric variables substantially constant.

In various embodiments, L2 may range from approximately 40% to approximately 60% (e.g., approximately 50%) of L1. In various embodiments, L2 is approximately equal to the distance between the two opposing ends of the spring (i.e., between terminal ends of the base portions). In various embodiments, R1 is less than or approximately equal to R3. In various embodiments, R4 is less than R1 and/or less than R3. In various embodiments, θ3 may range from approximately 40% to approximately 60% (e.g., approximately 50%) of θ1. In various embodiments, the distance between a contact point and its opposing base portion (i.e., the front-to-back distance) may range from approximately 4 mm to approximately 20 mm (or from approximately 4 mm to approximately 10 mm). In various embodiments, R4<R2<R1<R3. In various embodiments, θ2 is greater than 90°, greater than θ1, and/or greater than 03. In many embodiments, θ3 is less than θ1; however, in other embodiments, θ3 is equal to θ1 or less than θ1. In various embodiments, the ratio of θ1:θ3 varies from approximately 0.8 to approximately 1.66.

Various ones of the foregoing embodiments may have particularly advantageous properties. For example, in various embodiments, the displacement of the two points that contact the optic is intentionally not equal or linearly proportional to the displacement of the central lobe (or "bend") when the central lobe is "pulled" to deform the spring. This advantageously allows for more tolerance in the assembly process, because even a large variability in the distance along which the central lobe moves has minimal effect on the displacement of the contact points that contact the optic. Such embodiments allow spring deformation sufficient for installation of various different optics without the resulting stress on the spring exceeding the yield strength of the spring, and while still enabling the application of sufficient remnant spring force, once the optic is installed, to keep the optic in place. Such embodiments also provide these advantages while enabling various springs to be utilized in a variety of different mechanical mounts. Various ones of such embodiments are depicted in FIGS. 20-26.

Figure 3E:
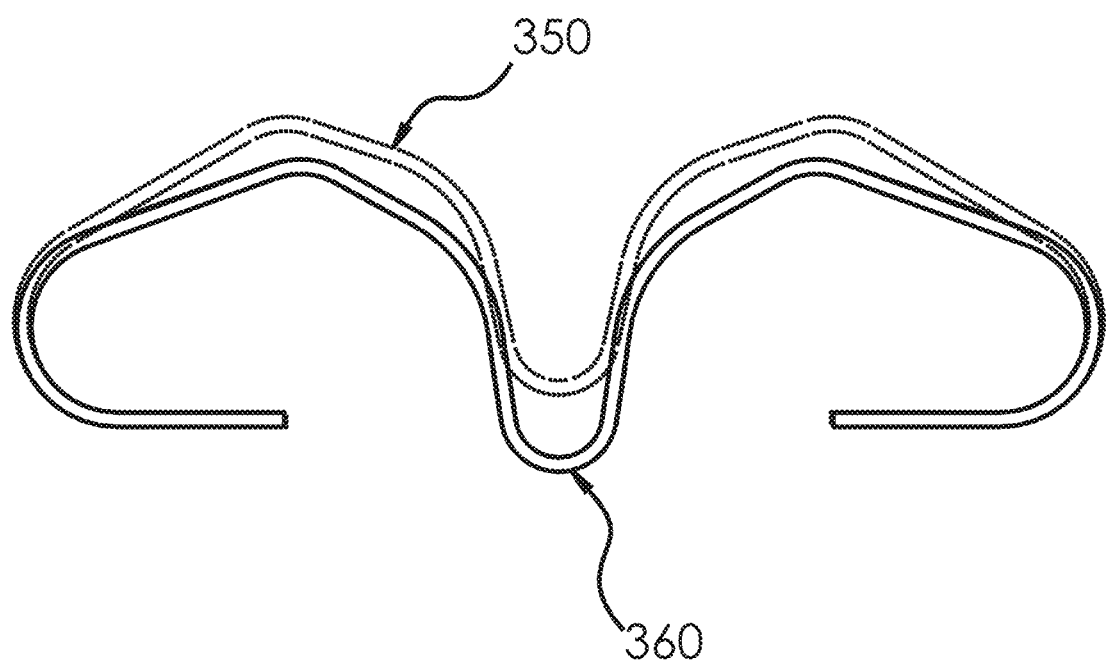
FIG. 3E is the schematic plan view of the exemplary spring of FIG. 3B, demonstrating action of the spring in accordance with various embodiments of the invention.

FIG. 3E depicts undeformed and deformed conformations 350, 360 of a spring 300 in accordance with embodiments of the invention. As shown, when the spring 300 is in place in the spring cradle (or other location on a mount) in undeformed conformation 350, the central bend 304 of the spring 300 is engaged (e.g., hooked, grasped, etc.) and pulled toward the stabilized base portions 306, deforming the spring 300 into deformed conformation 360. This opens a space forward of the contact portions 310 of the spring 300 sufficiently large to accommodate the optic or other object, which is placed on the mount in front of the spring 300. The central bend 304 of the spring 300 is then released, which allows the spring 30 to recover back toward (but typically not entirely into) the undeformed conformation 350 until the contact portions 310 contact the optic. The spring force of the spring 300 holds the optic in place against the mount.

Figure 4:
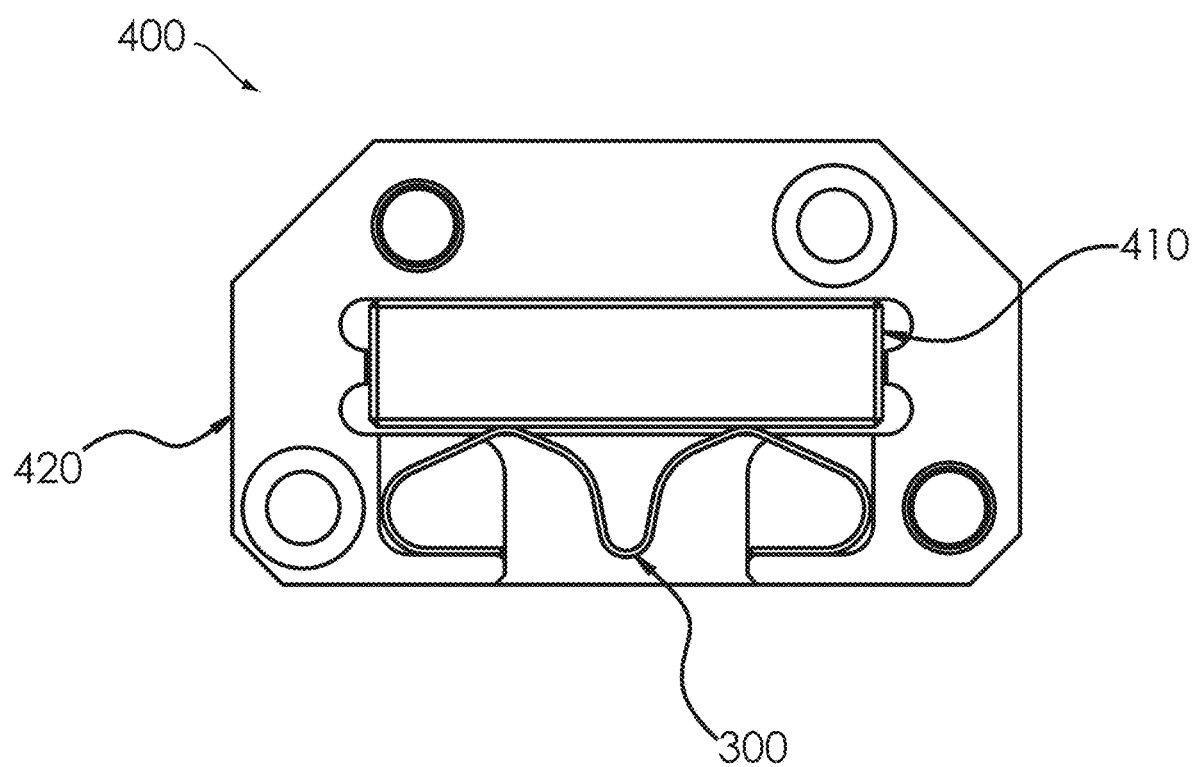
FIGS. 4 and 5 are, respectively, a schematic plan view and a schematic perspective view of an optical assembly in accordance with various embodiments of the invention.
Figure 5:
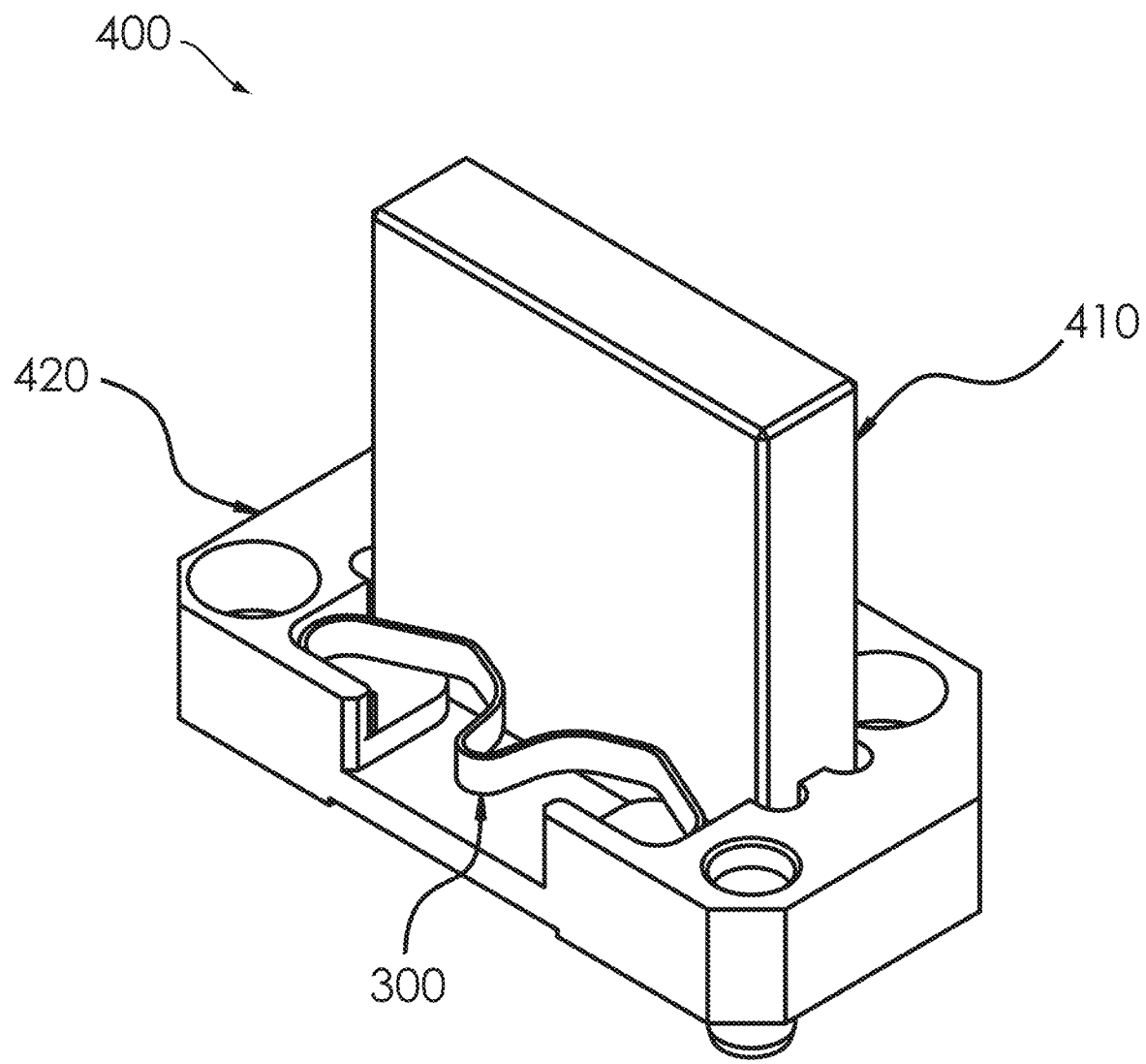

Springs in accordance with embodiments of the present invention may be utilized with many different optical assemblies, i.e., may different combinations of mechanical mounts and optics having various sizes and shapes. FIGS. 4 and 5 depict, respectively, a top view and a perspective view of an optical assembly 400 that includes spring 300 fixing an optic 410 on a mechanical mount 420. As shown, the optic 410 sits within a recess in the top surface of the mechanical mount 420 while the contact points of spring 300 press the optic 410 against the opposing side of the recess to fix the optic 410 in place. The base portions of the spring 300 are stabilized against portions of the mount 420 to maintain the elastic deformation of the spring 300 when the optic 410 is in place. The spring 300 is also recessed below the top surface of the mount 420, and the mount 420 defines an opening or cut-out to facilitate access to the central bend of the spring 300. Such access facilitates installation of the spring 300 and optic 410, as detailed below.

In the exemplary embodiment depicted in FIGS. 4 and 5, the front surface of optic 410 is a 25.4 mm square, the thickness of optic 410 is 6.35 mm thick, and optic 410 is situated at a 280 angle from the plane of the dowel pins in the mount 420 and parallel to the outside edge of the mount 420. Optic 410 may include, consist essentially of, or consist of, for example, a polarizer operable at different wavelengths and nominal angles of incidence, or a high-pass or low-pass dichroic mirrors operable at different wavelengths and angles of incidence. Such optics 410 may be utilized for, for example, beam polarization or wavelength beam combining within a laser resonator.

Figure 6:
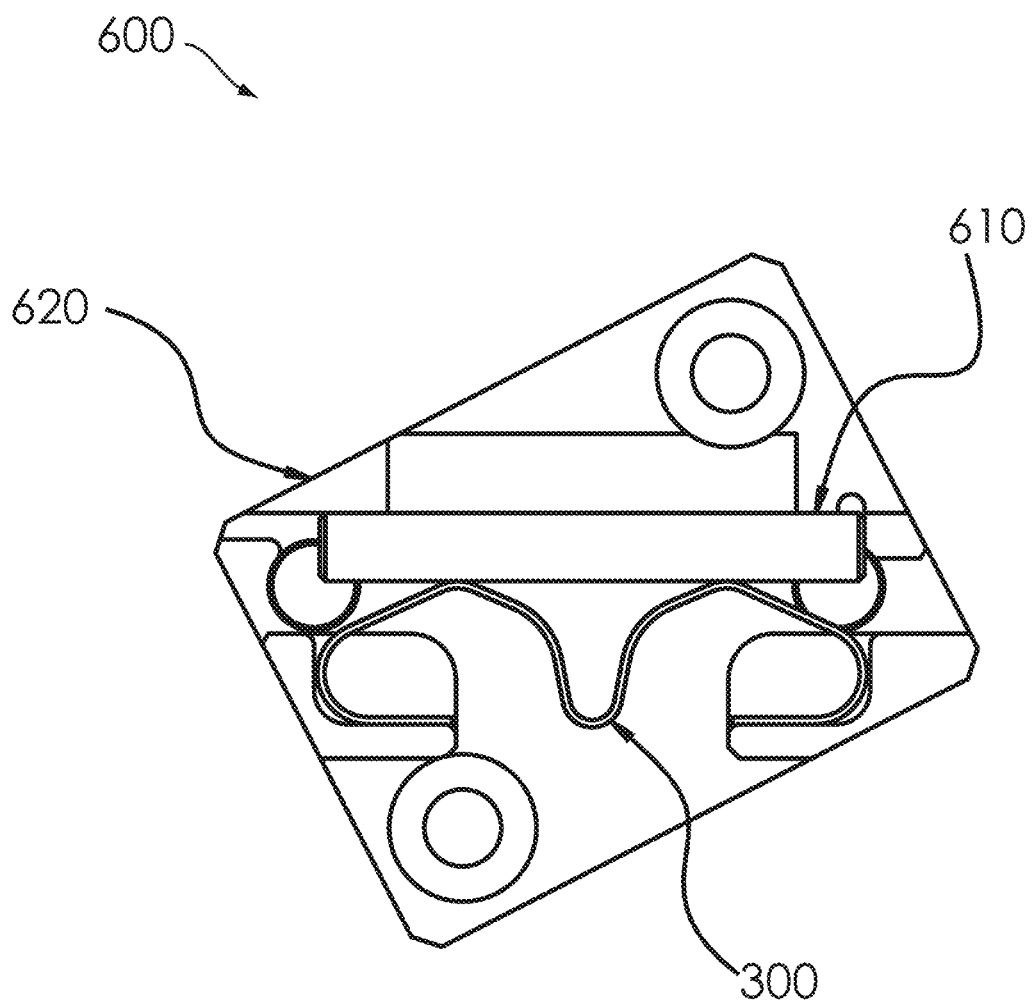
FIGS. 6 and 7 are, respectively, a schematic plan view and a schematic perspective view of an optical assembly in accordance with various embodiments of the invention.
Figure 7:
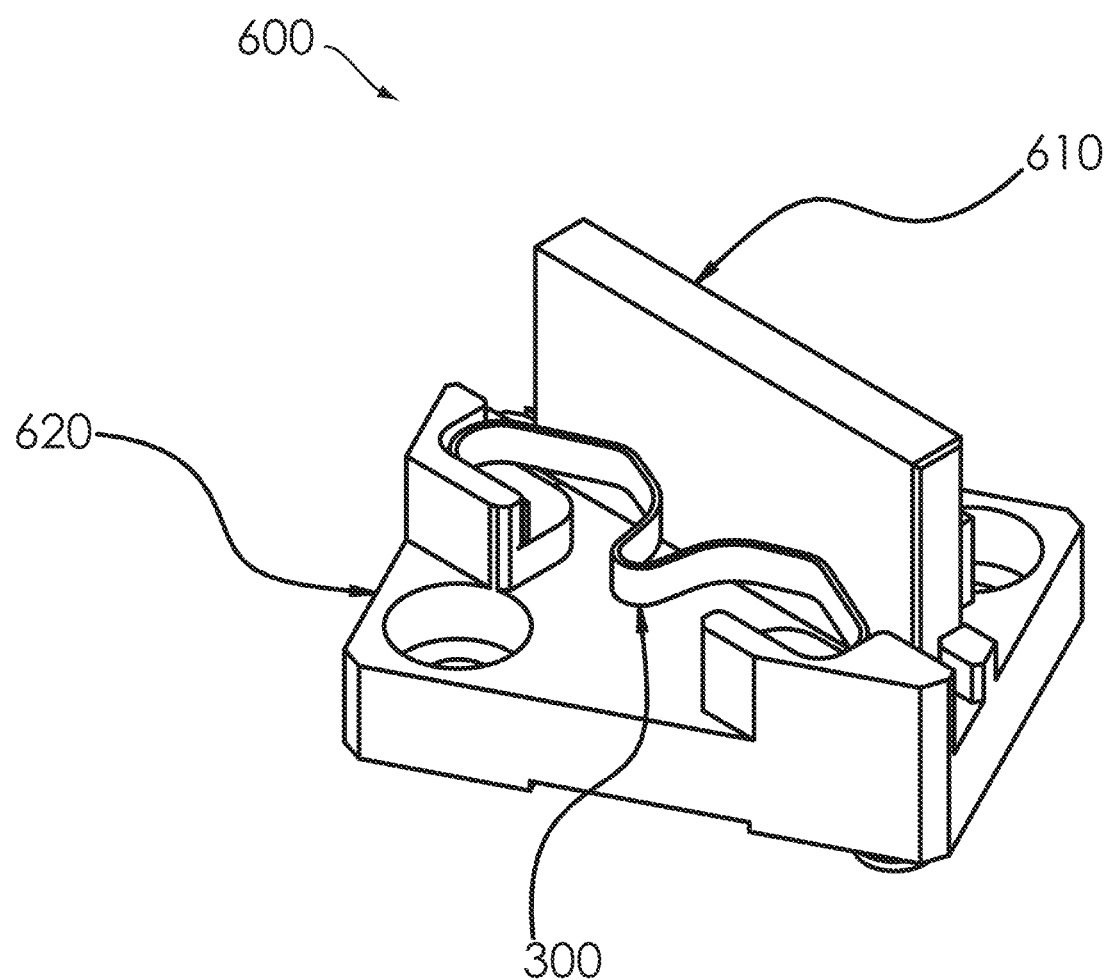

FIGS. 6 and 7 depict, respectively, a top view and a perspective view of an optical assembly 600 that includes spring 300 fixing an optic 610 on a mechanical mount 620. As shown, the optic 610 sits within a recess in the top surface of the mechanical mount 620 while the contact points of spring 300 press the optic 610 against the opposing side of the recess to fix the optic 610 in place. The base portions of the spring 300 are stabilized against elevated portions of the mount 620, raised over the remaining portions of the top surface of the mount 620, to maintain the elastic deformation of the spring 300 when the optic 610 is in place. Raised portions of the mount 620 also support the spring 300 from beneath, and there is an opening between these portions of the mount 620 that facilitates access to the central bend of the spring 300.

In the exemplary embodiment depicted in FIGS. 6 and 7, the optic 610 is a 24 mm×12 mm×3 mm rectangular prism and situated parallel to the dowel pins in the mount 620 and at an angle of 27° to the outside edge of the mount 620. Optic 610 may include, consist essentially of, or consist of, for example, a mirror that may be coated to be operable at different wavelengths and/or angles of incidence. Such optics 610 may be utilized for, for example, spatial beam combining within a laser resonator.

Figure 8:
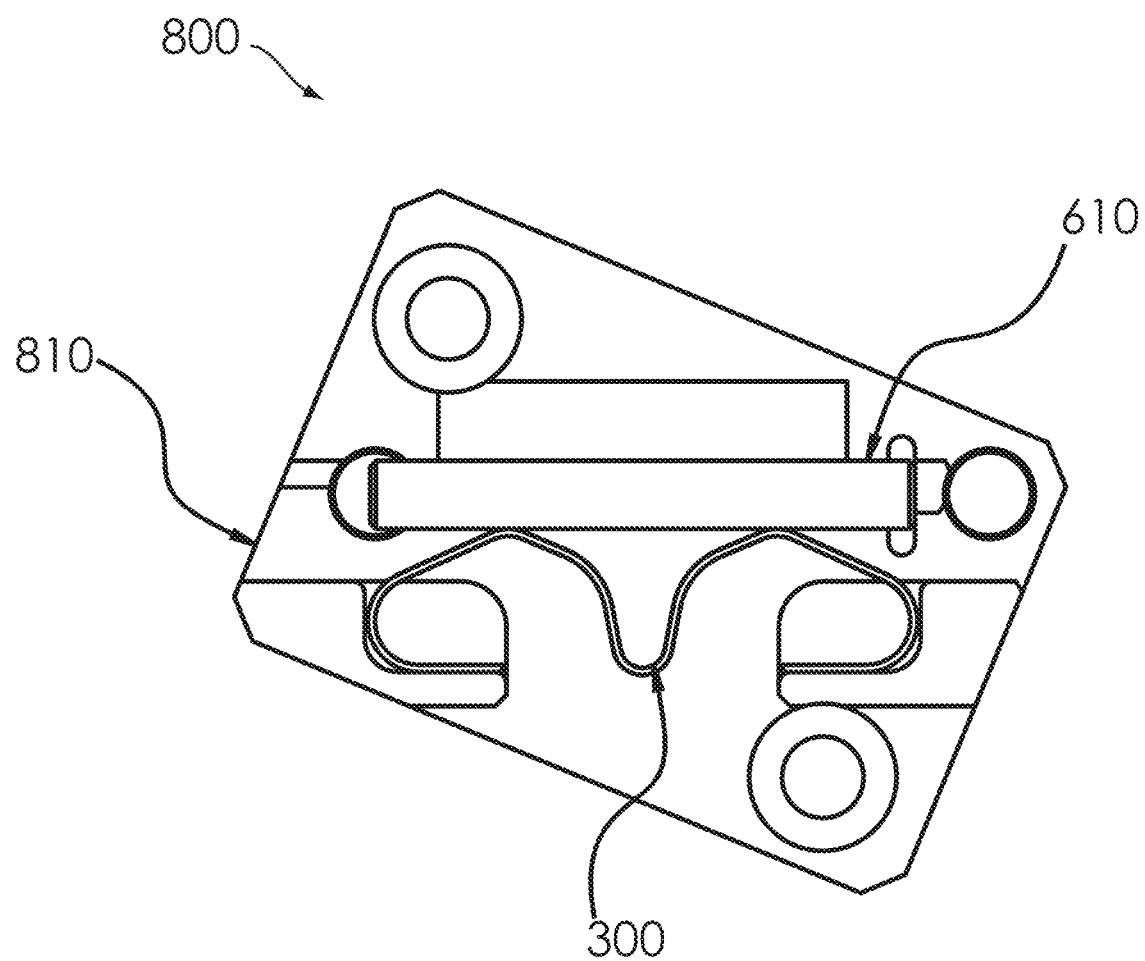
FIGS. 8 and 9 are, respectively, a schematic plan view and a schematic perspective view of an optical assembly in accordance with various embodiments of the invention.
Figure 9:
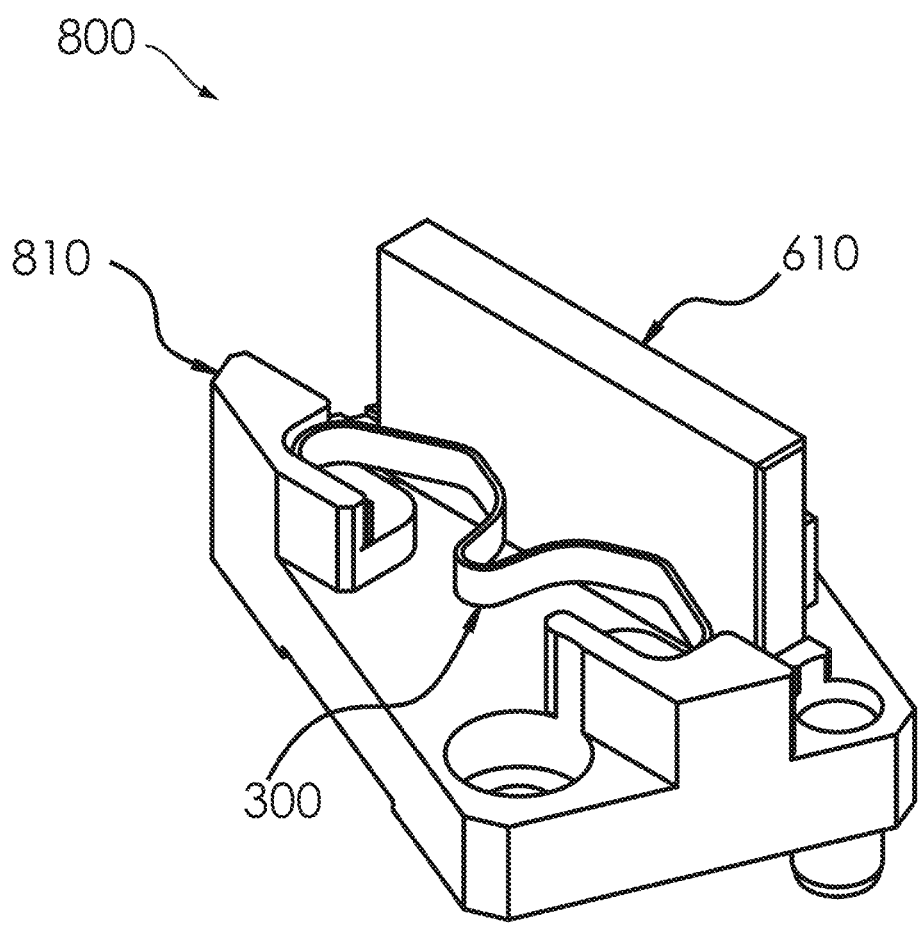

FIGS. 8 and 9 depict, respectively, a top view and a perspective view of an optical assembly 800 that includes spring 300 fixing optic 610 on a different mechanical mount 810. As shown, the optic 610 sits within a recess in the top surface of the mechanical mount 810 while the contact points of spring 300 press the optic 610 against the opposing side of the recess to fix the optic 610 in place. The base portions of the spring 300 are stabilized against elevated portions of the mount 810, raised over the remaining portions of the top surface of the mount 810, to maintain the elastic deformation of the spring 300 when the optic 610 is in place. Raised portions of the mount 810 also support the spring 300 from beneath, and there is an opening between these portions of the mount 810 that facilitates access to the central bend of the spring 300.

In the exemplary embodiment depicted in FIGS. 8 and 9, the optic 610 is situated parallel to the dowel pins in the mount 810 and at an angle of 22.5° to the outside edge of the mount 810. The positions of the mounting holes and dowel pins of mount 810 are swapped when compared to mount 620. In such an embodiment, optic 610 may be utilized as, for example, a turning or folding mirror, and/or may be utilized for spatial beam combining within a laser resonator.

Figure 10:
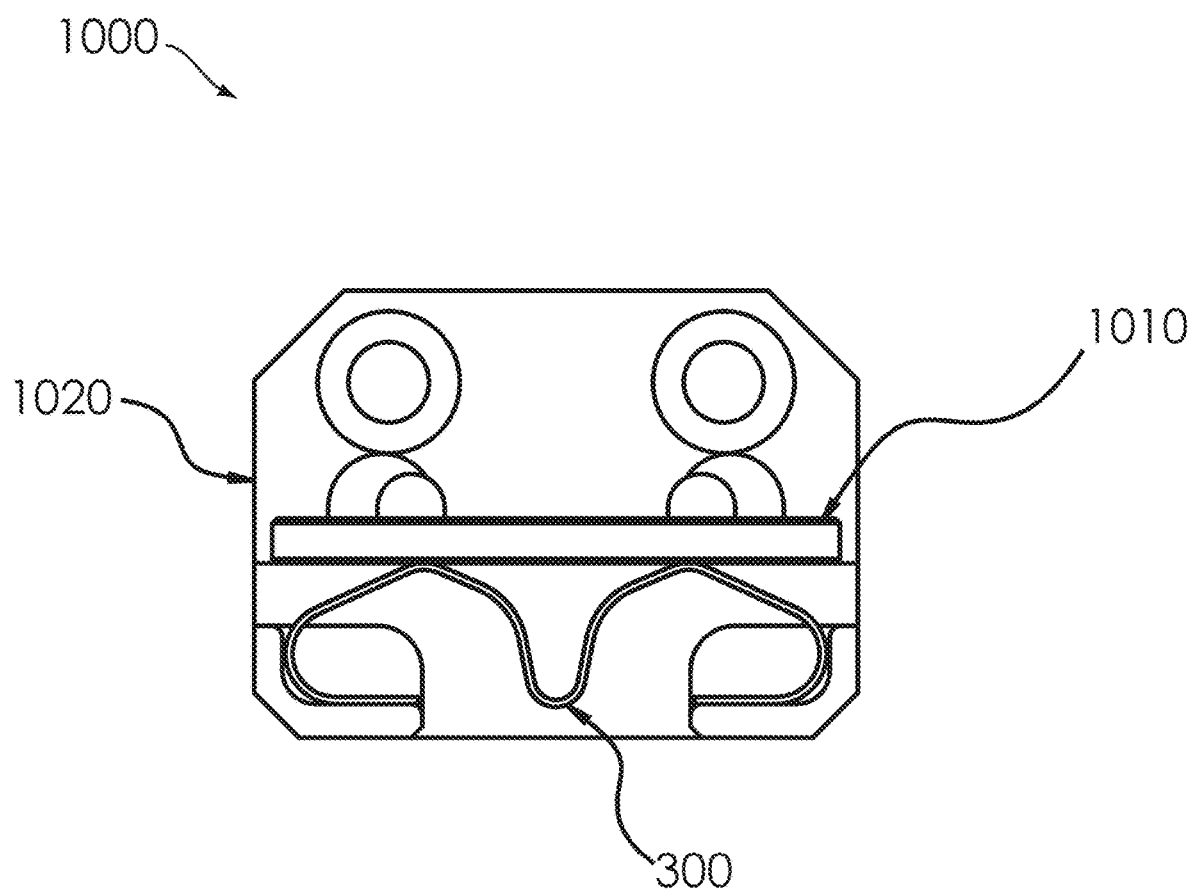
FIGS. 10 and 11 are, respectively, a schematic plan view and a schematic perspective view of an optical assembly in accordance with various embodiments of the invention.

FIGS. 10 and 11 depict, respectively, a top view and a perspective view of an optical assembly 1000 that includes spring 300 fixing an optic 1010 on a mechanical mount 1020. As shown, the optic 1010 sits within a recess in the top surface of the mechanical mount 1020 while the contact points of spring 300 press the optic 1010 against the opposing side of the recess to fix the optic 1010 in place. The base portions of the spring 300 are stabilized against portions of the mount 620 to maintain the elastic deformation of the spring 300 when the optic 610 is in place, and the spring 300 is situated within and supported within a recess defined in the top surface of the mount 1020. There is an opening in the front surface of the mount 1020 that facilitates access to the central bend of the spring 300.

In the exemplary embodiment depicted in FIGS. 10 and 11, the optic 1010 is a disc having a diameter of 25.4 mm and a thickness of 2 mm. In various embodiments, the optic 1010 may include, consist essentially of, or consist of, for example, a diffuser and therefore be coated with a suitable coating. For example, the optic 1010 may be coated with a 120 grit silver reflective coating such as Thorlabs DG10-120-P01. The optic 1010 may be utilized to, for example, scatter stray light that inadvertently passes through a mirror or other reflector within a laser resonator.

Figure 12:
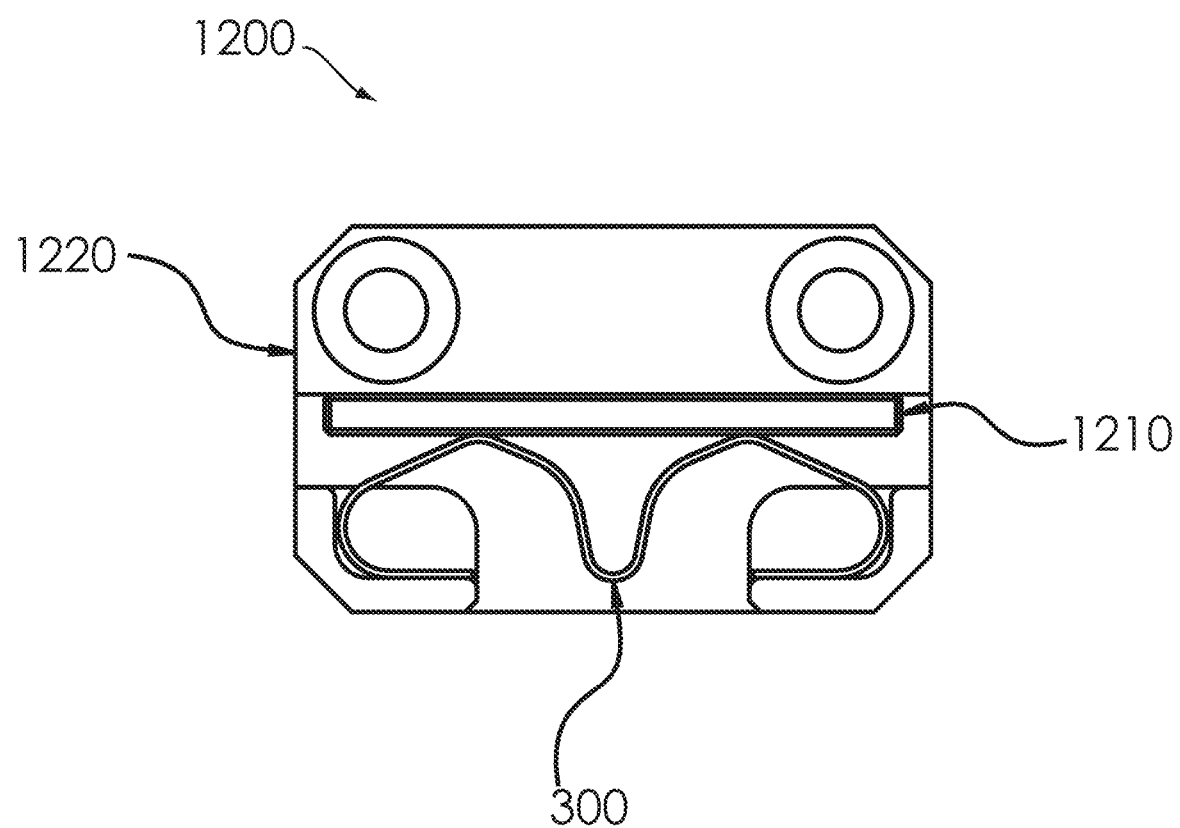
FIGS. 12 and 13 are, respectively, a schematic plan view and a schematic perspective view of an optical assembly in accordance with various embodiments of the invention.
Figure 13:
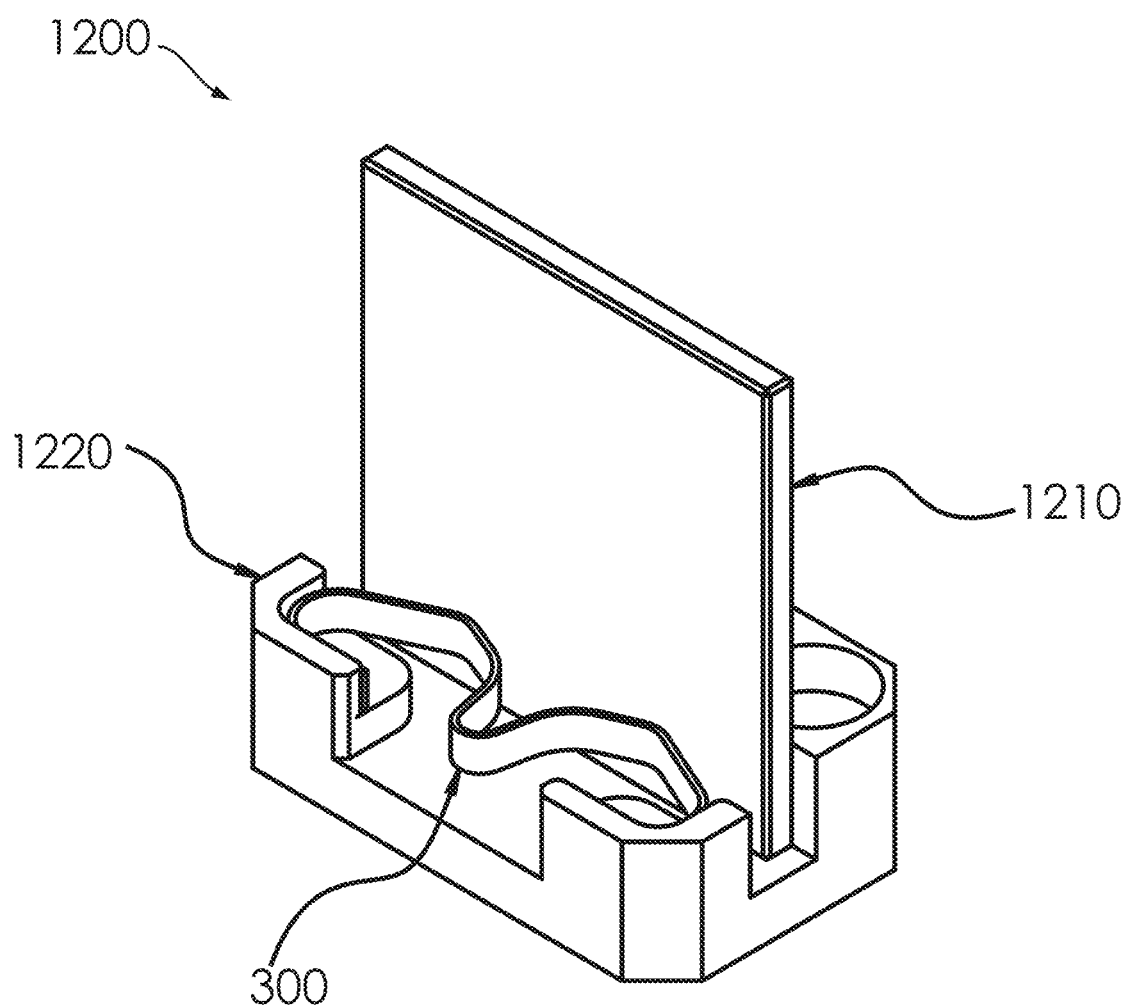

FIGS. 12 and 13 depict, respectively, a top view and a perspective view of an optical assembly 1200 that includes spring 300 fixing an optic 1210 on a mechanical mount 1220. As shown, the optic 1210 sits within a recess in the top surface of the mechanical mount 1220 while the contact points of spring 300 press the optic 1210 against the opposing side of the recess to fix the optic 1210 in place. The base portions of the spring 300 are stabilized against portions of the mount 1220 to maintain the elastic deformation of the spring 300 when the optic 1210 is in place. There is an opening in the front surface of the mount 1220 that facilitates access to the central bend of the spring 300.

In the exemplary embodiment depicted in FIGS. 12 and 13, the front surface of optic 1210 is a 25.4 mm square, the thickness of optic 1210 is 2 mm, and optic 1210 is situated parallel to the outside edge of the mount 1220 and the mounting holes for mount 1220. Optic 1210 may include, consist essentially of, or consist of, for example, a quarter waveplate or a half waveplate that may manipulate a beam for, e.g., polarization combining in or fiber coupling from a laser resonator.

Figure 14:
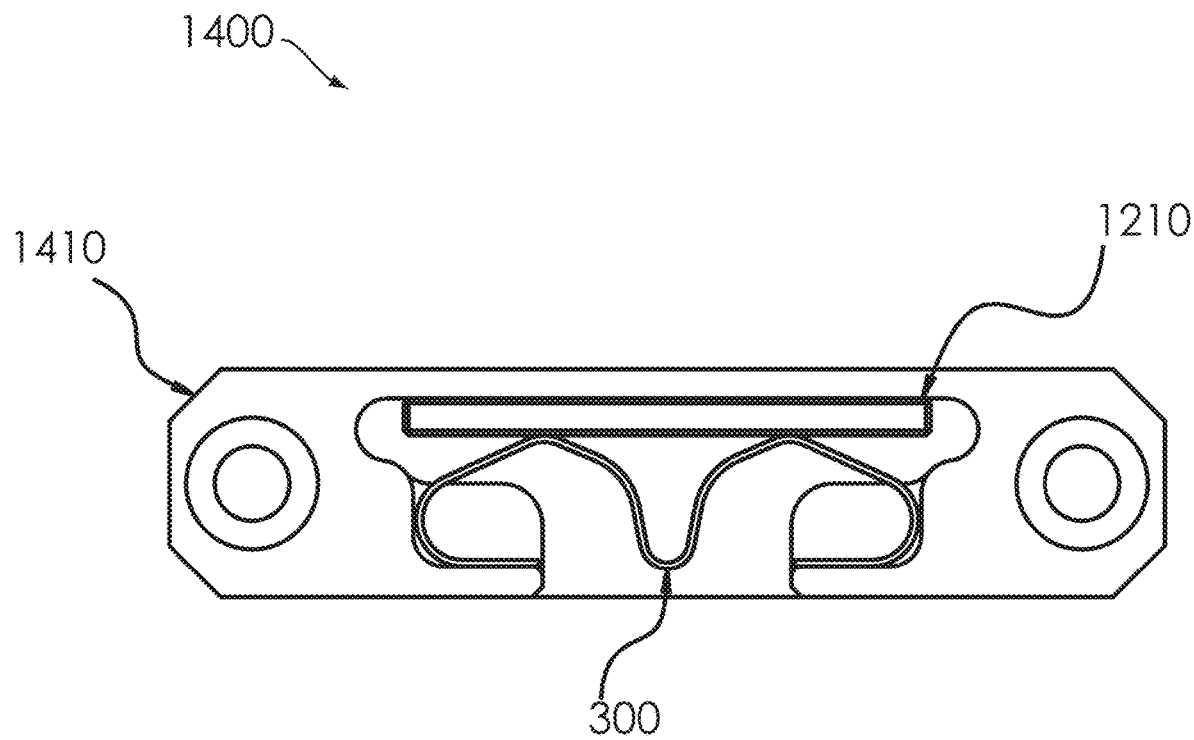
FIGS. 14 and 15 are, respectively, a schematic plan view and a schematic perspective view of an optical assembly in accordance with various embodiments of the invention.
Figure 15:
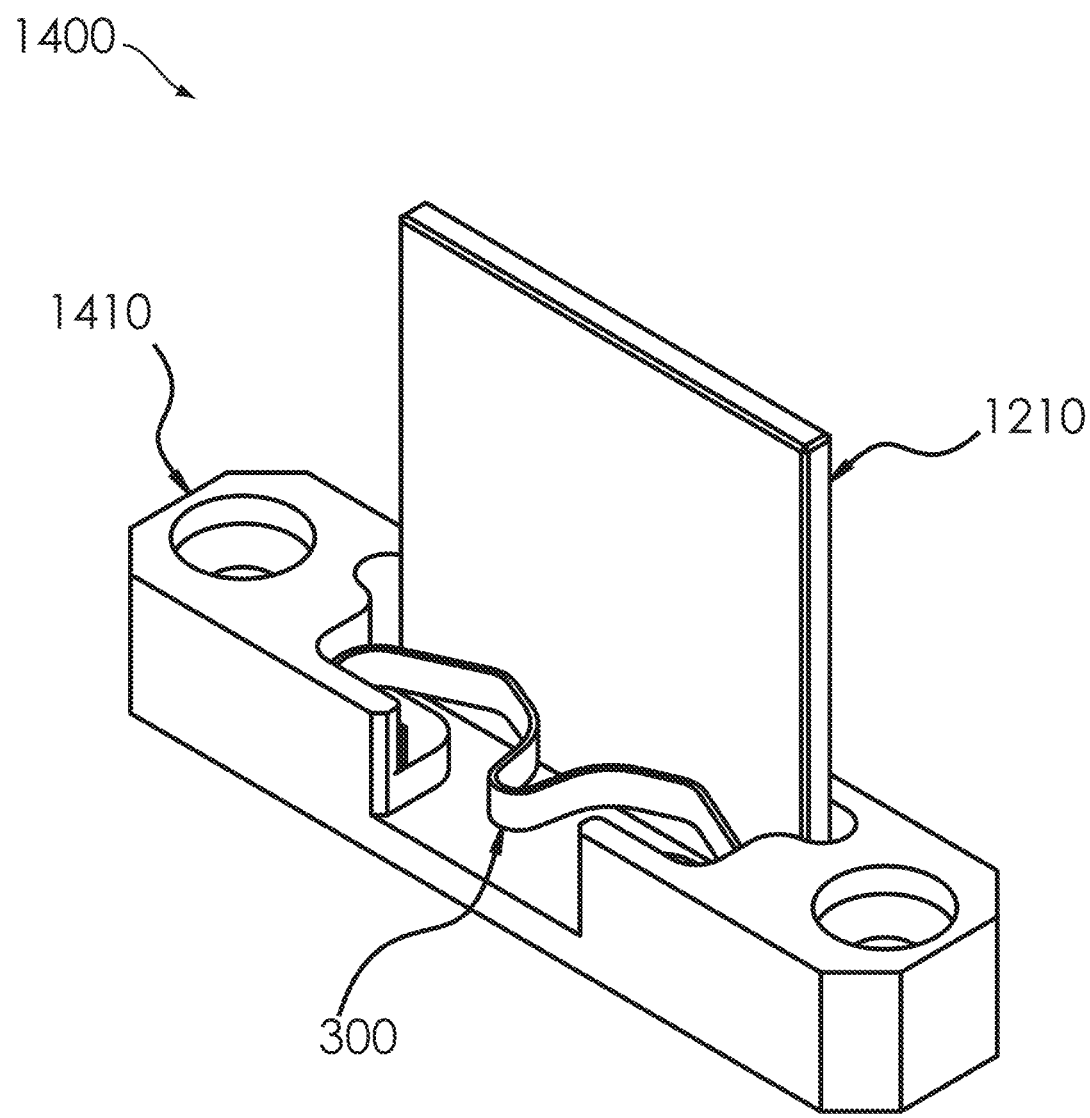

FIGS. 14 and 15 depict, respectively, a top view and a perspective view of an optical assembly 1400 that includes spring 300 fixing optic 1210 on a different mechanical mount 1410. As shown, the optic 1210 sits within a recess in the top surface of the mechanical mount 1410 while the contact points of spring 300 press the optic 1210 against the opposing side of the recess to fix the optic 1210 in place. The spring 300 is situated within the recess in mechanical mount 1410 and supported at a different, higher vertical level. The base portions of the spring 300 are stabilized against portions of the mount 1410 to maintain the elastic deformation of the spring 300 when the optic 1210 is in place. There is an opening in the mount 1410 that facilitates access to the central bend of the spring 300.

In the exemplary embodiment depicted in FIGS. 14 and 15, the mounting holes of the mount 1410 are situated to the side of, rather than behind (as in FIGS. 12 and 13) the optic 1210. This demonstrates that different mount configurations may be utilized for the same optic and spring, depending upon the layout of the laser system and available space for, e.g., mounting holes for the mount.

Springs 300 in accordance with embodiments of the invention may also be used to fix a variety of other optics on various mechanical mounts. For example, the optic need not have front and back surfaces that are parallel—springs 300 may be utilized to secure concave or convex optics such as cylindrical and spherical lenses on mechanical mounts. In addition, in accordance with various embodiments, the base portions of the spring 300 may be parallel to the outside edge of the mount (as shown in, for example, FIGS. 4, 10, 12, and 14), while in other embodiments the base portions of the spring 300 need not be parallel to the outside edge of the mount (as shown in, for example, FIGS. 6 and 8). In general, as long as the spring 300 is supported by features of the mount that are parallel to the optic itself, the spring and optic themselves need not be situated parallel to the edge of the mount.

Figure 16:
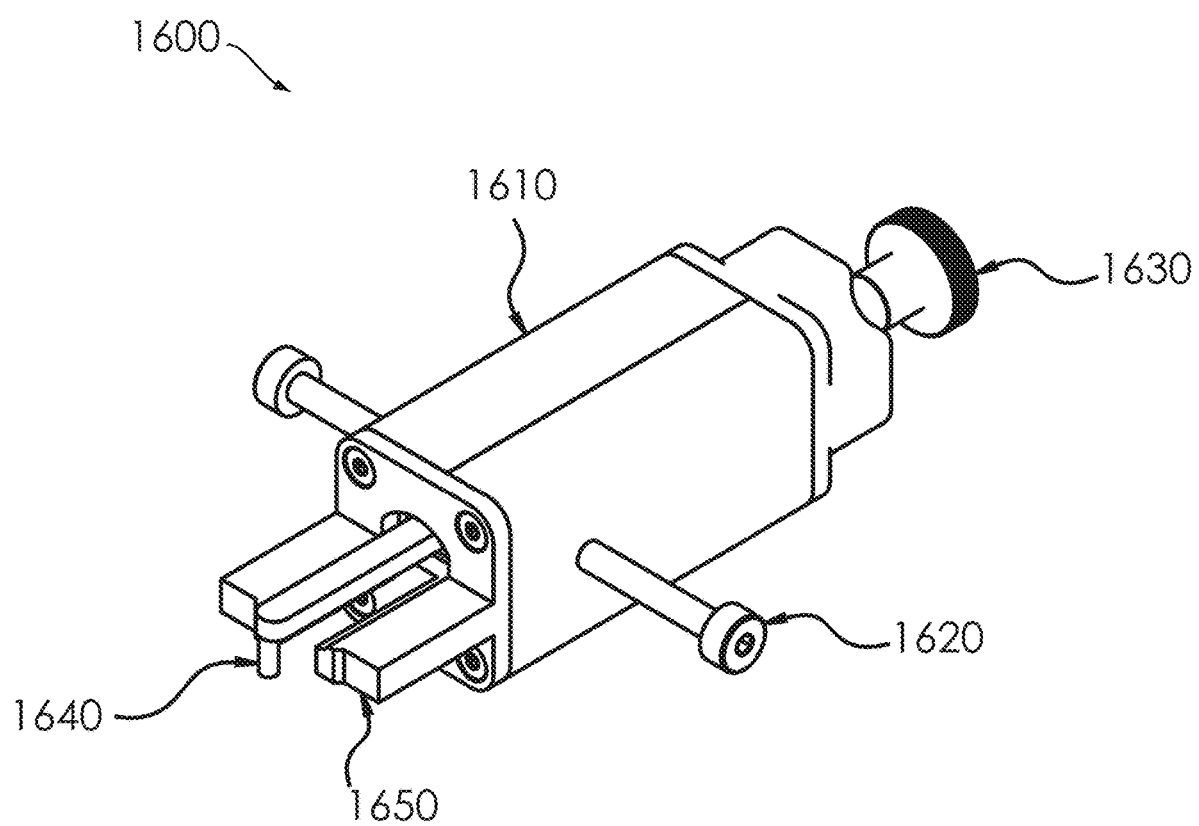
FIG. 16 is a schematic perspective view of an exemplary hand-held tool usable in installation techniques in accordance with various embodiments of the invention.

Embodiments of the present invention also include devices or tools used for fixing an optic with a spring within a mechanical mount. FIG. 16 depicts an exemplary hand-held tool 1600 usable in installation techniques in accordance with embodiments of the invention. As shown, the tool 1600 includes a body 1610 from which two projections 1620 extend. During installation, the projections 1620 may be utilized as supports for the fingers of the operator of the tool 1600. The tool 1600 also includes a plunger 1630, operable by the user (e.g., via pressing by thumb), to actuate a hook 1640 that extends from the front of the tool 1600 and is configured to engage with the central bend of the spring 300. The tool 1600 may also include a stabilizer 1650 that extends from the front surface of the body 1610 and is configured to rest against the surface of the mechanical mount during actuation of the hook 1640 (and thus deformation of the spring), thereby stabilizing the tool 1600 during installation.

Figure 17:
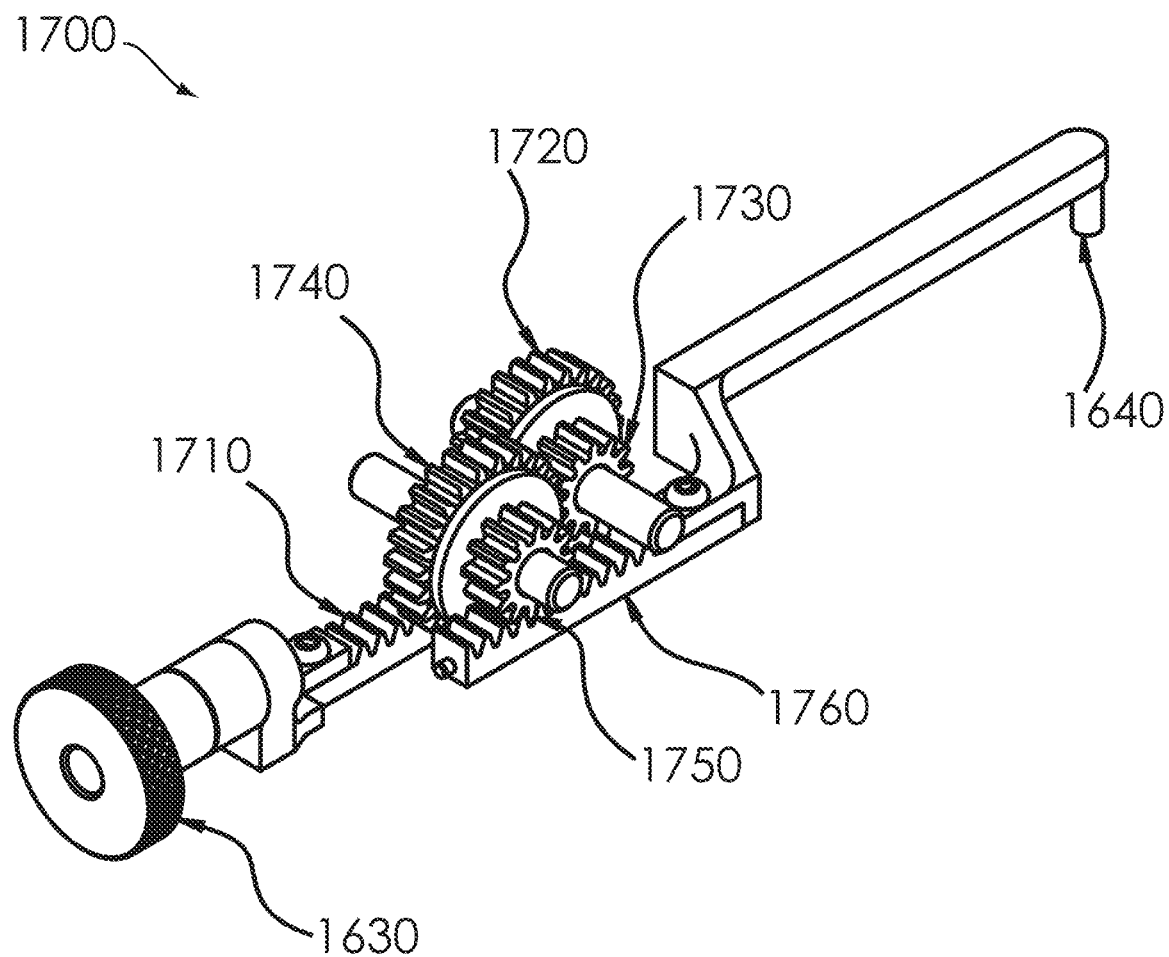
FIG. 17 is a schematic perspective view of an exemplary internal mechanism of the tool depicted in FIG. 16, in accordance with various embodiments of the invention.

FIG. 17 depicts an exemplary internal mechanism 1700 of the tool 1600 depicted in FIG. 16. The internal mechanism 1700 and tool 1600 are configured so that the hook 1640 retracts when the plunger 1630 is pressed by the user. In the illustrated exemplary embodiment, the internal mechanism includes a plunger gear rack 1710 that is coupled to the plunger 1630, a first pinion gear 1720 that meshes with the plunger gear rack 1710, a second pinion gear 1730 that is fixed to pinion gear 1720 such that they rotate together, a third pinion gear 1740 that meshes with pinion gear 1730, a fourth pinion gear 1750 that is fixed to pinion gear 1740 such that they rotate together, and a hook gear rack 1760 that meshes with pinion gear 1750 and that is coupled to the hook 1640.

The tool 1600 illustrated in FIGS. 16 and 17 is configured so that pushing the plunger 1630 causes the hook 1640 to retract. In various embodiments, the internal gears may be configured in different ratios to amplify or reduce the stroke length. As an example, the configuration depicted in FIG. 17 yields a 4:1 reduction—e.g., pushing the plunger 1630 in 4 mm causes the hook 1640 to retract 1 mm. A spring, not shown, causes the hook 1640 to move back to its initial position when the pressure on the plunger 1630 is removed. In other embodiments, the tool and its internal mechanism may be configured to retract the hook via retraction or pulling of the plunger.

Figures 18A, 18B, 18C, 18D:
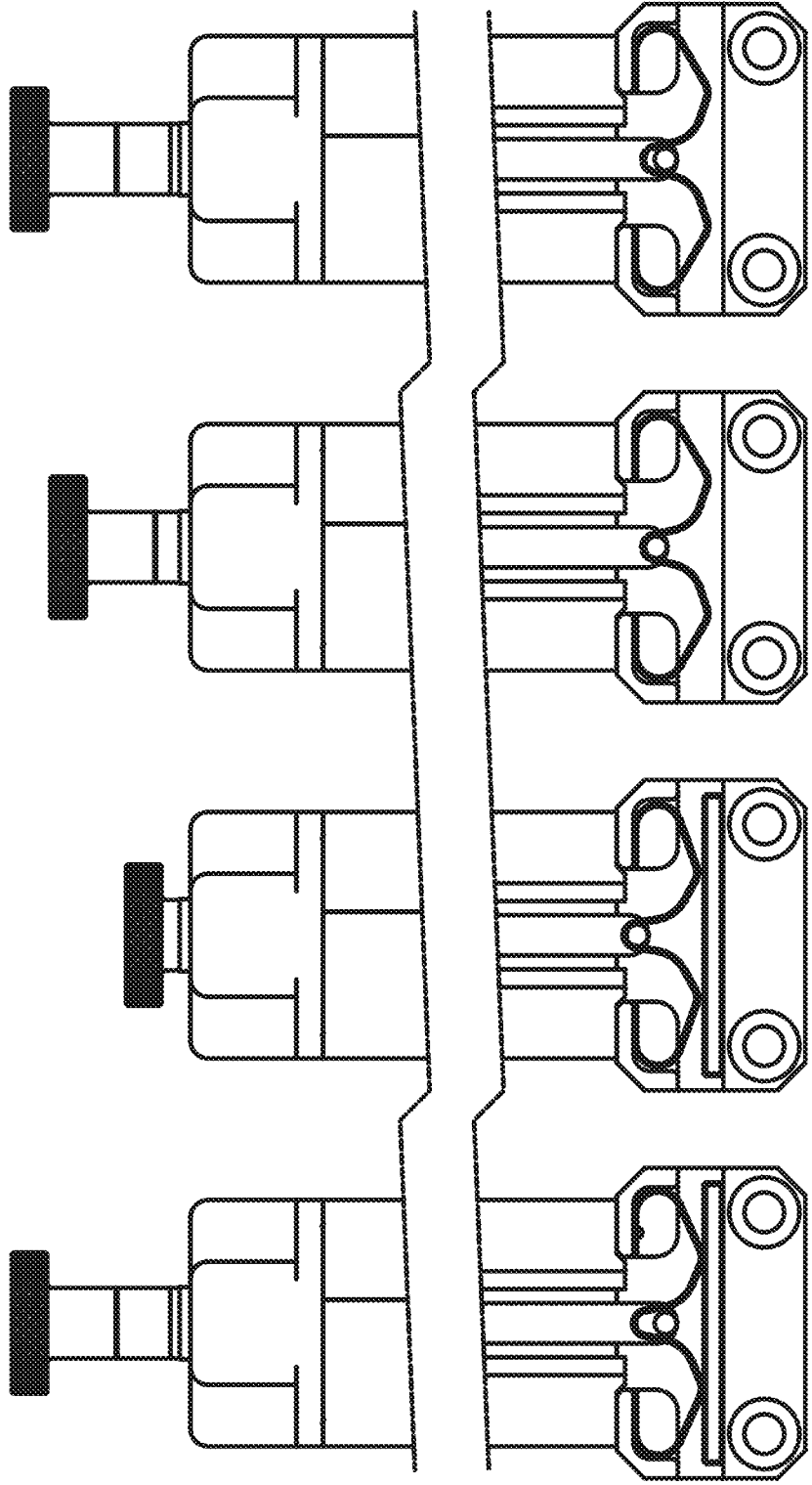
FIGS. 18A-18D are schematic plan views of steps of a technique for installation of an optic using the tool of FIG. 16, in accordance with various embodiments of the invention.
Figure 19:
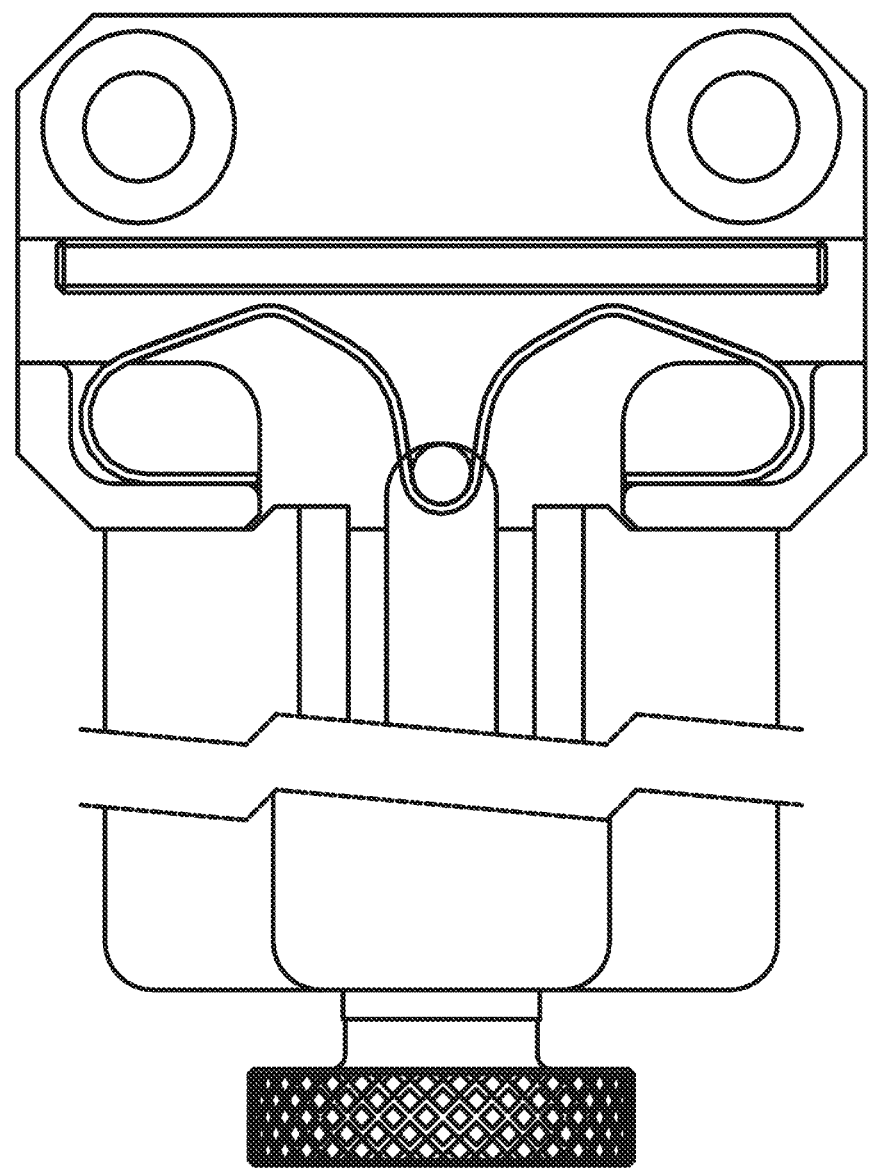
FIG. 19 is a magnified view of FIG. 18C.
Figure 20:
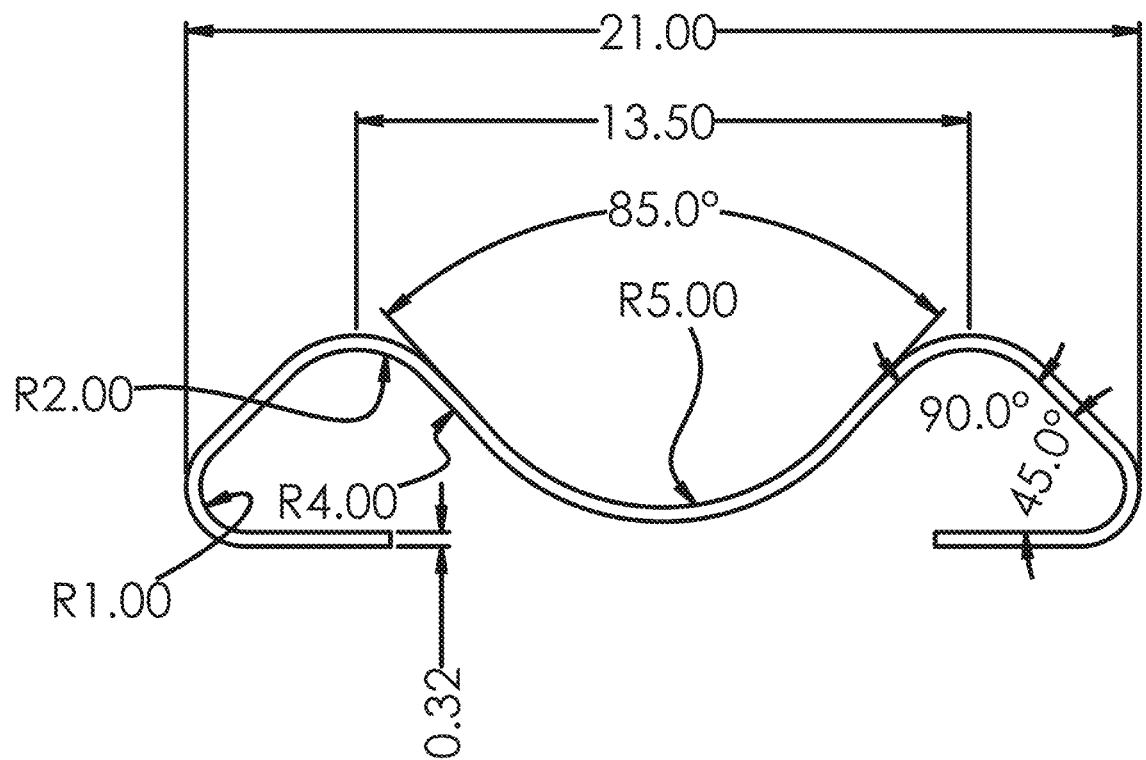
FIGS. 20-26 are schematic plan views of springs in accordance with various embodiments of the invention.
Figure 21:
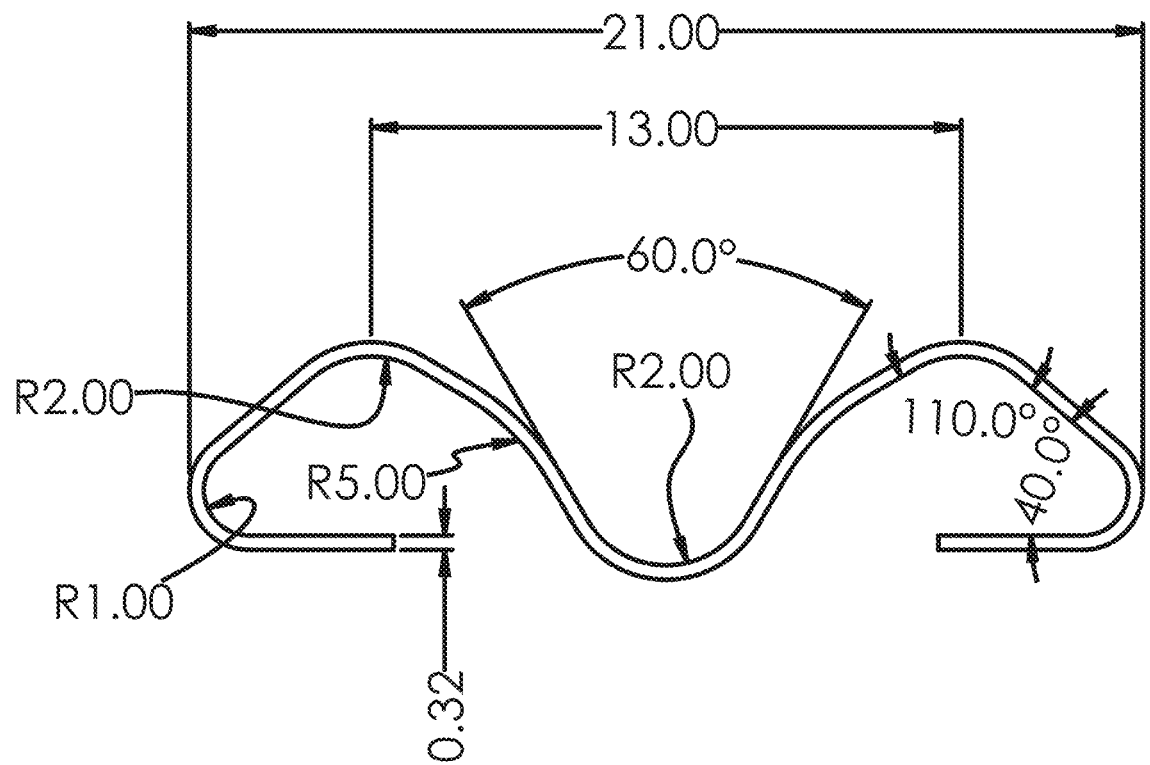
Figure 22:
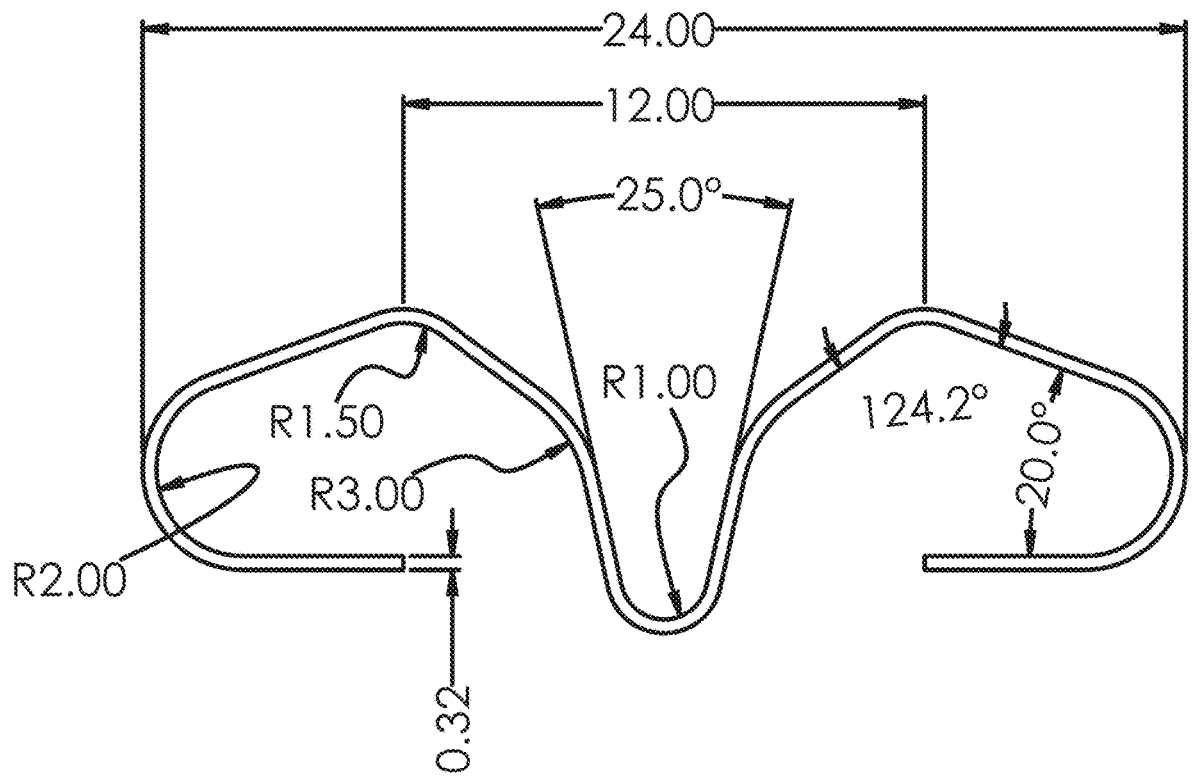
Figure 23:
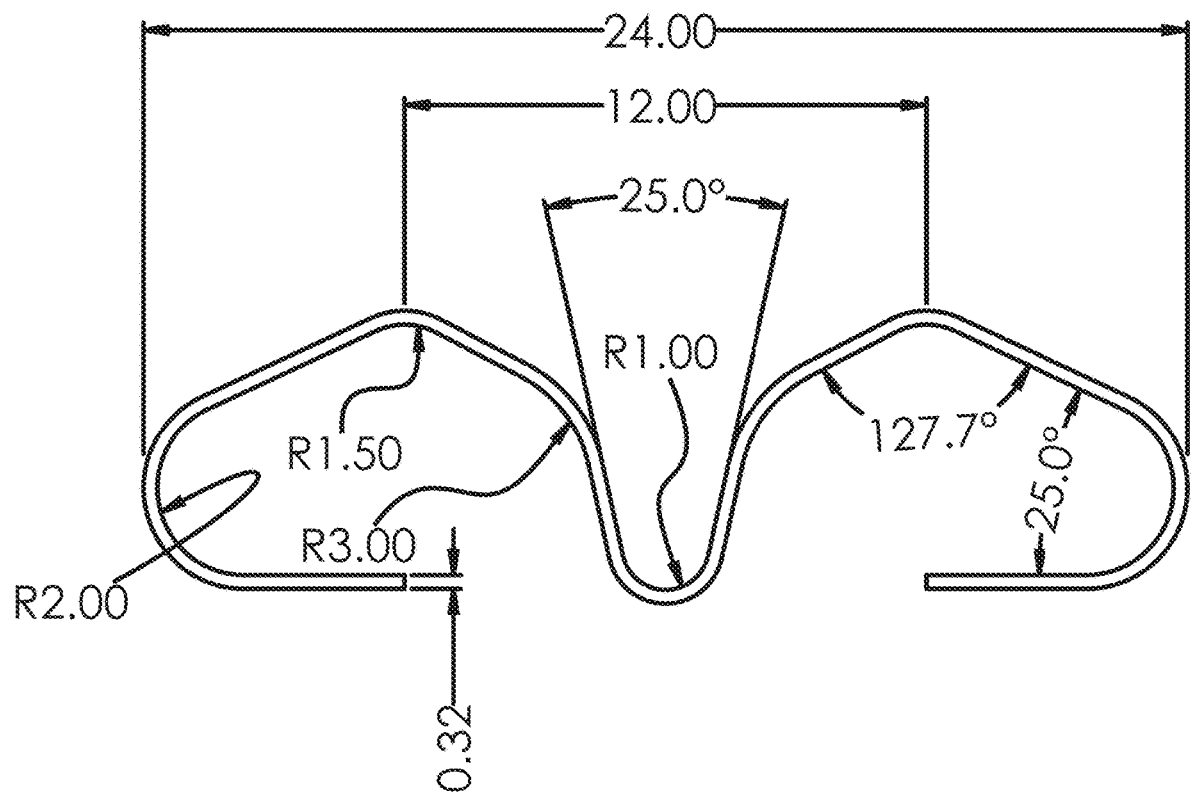
Figure 24:
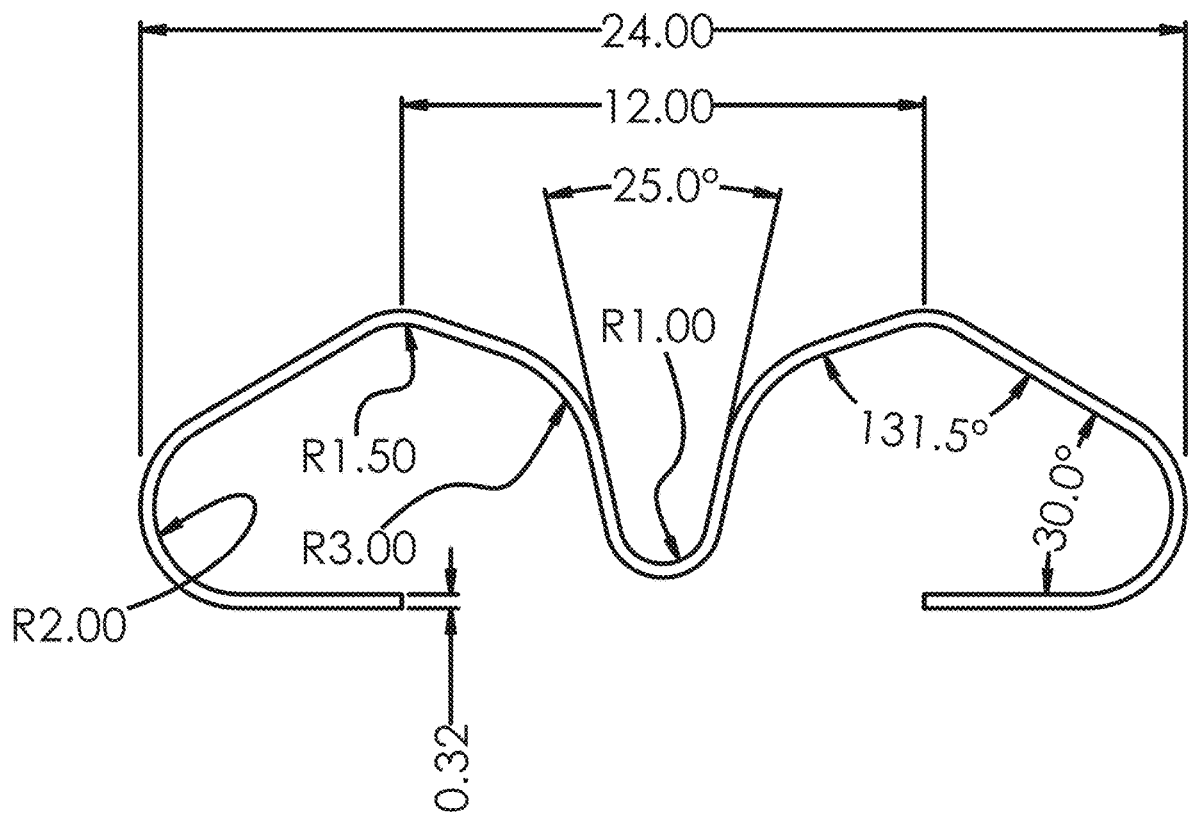
Figure 25:
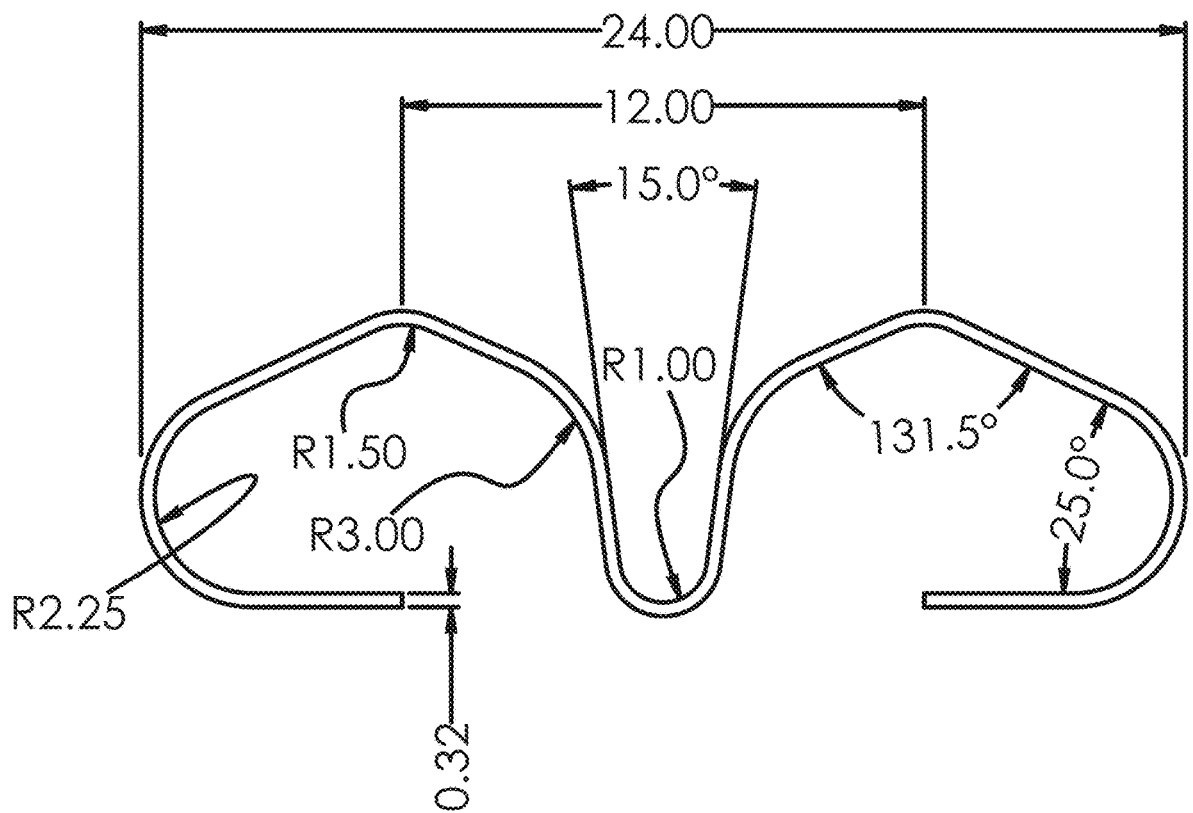
Figure 26:
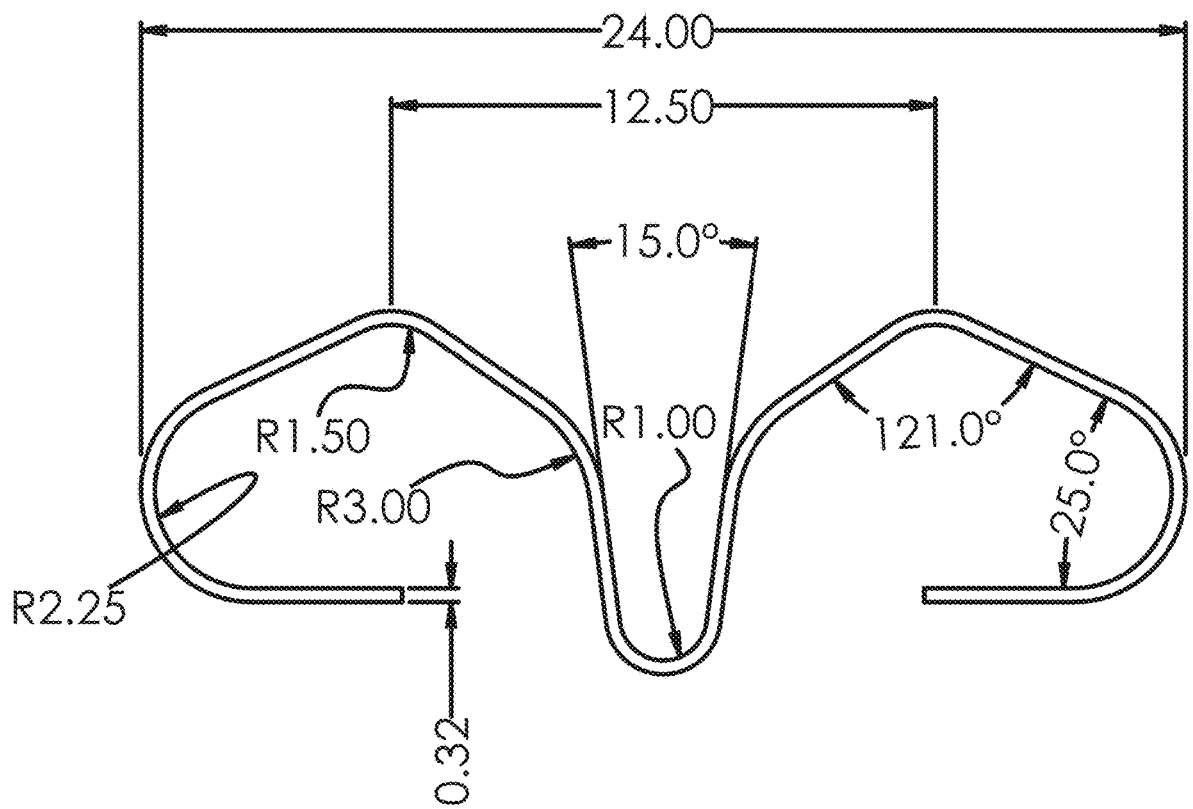

FIGS. 18A-18D are top views of an exemplary assembly process utilizing the tool 1600 depicted in FIG. 16 to fix an optic on a mechanical mount. In FIG. 18A, the spring 300 is placed within the recessed feature (or "cradle") of the mechanical mount, and the stabilizer 1650 of the tool 1600 is positioned against the front surface of the mechanical mount with the hook 1640 disposed within the central bend of the spring 300. In this initial position, as shown, the hook 1640 may not be in contact with the spring 300 or its central bend. In FIG. 18B, the plunger 1630 is pushed by an intermediate amount, which retracts the hook 1640 to be in contact with the central bend of the spring 300, but the spring 300 is not yet deformed. In FIG. 18C, the plunger 1630 is pushed in fully, deforming the spring 300 via retraction of the hook 1640. As shown, the spring deformation creates sufficient clearance on the mount to enable insertion of the optic on the mount in front of the contact points of the spring 300. In various embodiments, the tool 1600 is configured to deform the spring 300 to create this required clearance while not exerting stress on the spring 300 sufficient to exceed the yield point of the spring 300. In FIG. 18D, the plunger 1630 has been released, and the internal spring of the tool causes the hook 1640 to move back to its initial position. As the hook 1640 moves forward toward the optic, the spring 300 is released and recovers toward its initial, unstressed/undeformed state until the contact points of the spring 300 contact the optic. In various embodiments, the mirror symmetry of the spring 300 across the central bend thereof allows the force exerted by the spring 300 to self-balance between the two contact points even when the spring 300 and/or mount are not manufactured to their exact nominal dimensions. FIG. 19 is a magnified view corresponding to the view of FIG. 18C, depicting the installation clearance between the spring 300 and the optic when the plunger 1630 is pressed in fully.

FIGS. 20-26 depict various exemplary embodiments of springs in accordance with embodiments of the present invention. While these figures depict various different examples, they are not intended to be exhaustive or otherwise limiting; embodiments of the invention include many other springs having similar or different features or dimensions. As shown, the example springs have the following dimensions:

| FIG. | T1 (mm) | L1 (mm) | L2 (mm) | θ1 (deg) | θ2 (deg) | θ3 (deg) | R1 (mm) | R2 (mm) | R3 (mm) | R4 (mm) | H (mm) |
|---|---|---|---|---|---|---|---|---|---|---|---|
| 20 | 0.32 | 21.00 | 13.5 | 45.0 | 90.0 | 85.0 | 1.00 | 2.00 | 4.00 | 5.00 | 2.00 |
| 21 | 0.32 | 21.00 | 13.0 | 40.0 | 110.0 | 60.0 | 1.00 | 2.00 | 5.00 | 2.00 | 2.00 |
| 22 | 0.32 | 24.00 | 12.00 | 20.0 | 124.2 | 25.0 | 2.00 | 1.50 | 3.00 | 1.00 | 2.00 |
| 23 | 0.32 | 24.00 | 12.00 | 25.0 | 127.7 | 25.0 | 2.00 | 1.50 | 3.00 | 1.00 | 2.00 |
| 24 | 0.32 | 24.00 | 12.00 | 30.0 | 131.5 | 25.0 | 2.00 | 1.50 | 3.00 | 1.00 | 2.00 |
| 25 | 0.32 | 24.00 | 12.00 | 25.0 | 131.5 | 15.0 | 2.25 | 1.50 | 3.00 | 1.00 | 2.00 |
| 26 | 0.32 | 24.00 | 12.50 | 25.0 | 121.0 | 15.0 | 2.25 | 1.50 | 3.00 | 1.00 | 2.00 |

As mentioned herein, in various embodiments of the present invention, laser resonators may incorporate one or more springs 300 to fix in place one or more optical elements on one or more mounts, and the optical elements may be utilized to manipulate laser radiation, resulting in formation of a final output beam of the resonator or system. The output beams of the laser systems or laser resonators may be propagated, e.g., via a fiber optic module, to a delivery optical fiber (which may be coupled to a laser delivery head) and/or utilized to process a workpiece. For example, the output beam from the resonator module depicted in FIGS. 2A and 2B may be coupled into a delivery fiber, or the output beam may be combined with the output beams of one or more such resonators (via, e.g., polarization beam combining, spatial beam combining, etc.), and the combined beam may be coupled into a delivery fiber for processing of a workpiece.

In various embodiments, a laser head contains one or more optical elements utilized to focus the output beam onto a workpiece for processing thereof. For example, laser heads in accordance with embodiments of the invention may include one or more collimators (i.e., collimating lenses) and/or focusing optics (e.g., one or more focusing lenses). A laser head may not include a collimator if the beam(s) entering the laser head are already collimated. Laser heads in accordance with various embodiments may also include one or more protective window, a focus-adjustment mechanism (manual or automatic, e.g., one or more dials and/or switches and/or selection buttons). Laser heads may also include one or more monitoring systems for, e.g., laser power, target material temperature and/or reflectivity, plasma spectrum, etc. A laser head may also include optical elements for beam shaping and/or adjustment of beam quality (e.g., variable BPP) and may also include control systems for polarization of the beam and/or the trajectory of the focusing spot. In various embodiments, the laser head may include one or more optical elements (e.g., lenses) and a lens manipulation system for selection and/or positioning thereof for, e.g., alteration of beam shape and/or BPP of the output beam, as detailed in U.S. patent application Ser. No. 15/188,076, filed on Jun. 21, 2016, the entire disclosure of which is incorporated by reference herein. Exemplary processes include cutting, piercing, welding, brazing, annealing, etc. The output beam may be translated relative to the workpiece (e.g., via translation of the beam and/or the workpiece) to traverse a processing path on or across at least a portion of the workpiece.

In embodiments utilizing an optical delivery fiber, the optical fiber may have many different internal configurations and geometries. For example, the optical fiber may include, consist essentially of, or consist of a central core region and an annular core region separated by an inner cladding layer. One or more outer cladding layers may be disposed around the annular core region. Embodiments of the invention may incorporate optical fibers having configurations described in U.S. patent application Ser. No. 15/479,745, filed on Apr. 5, 2017, U.S. patent application Ser. No. 15/879,500, filed on Jan. 25, 2018, and U.S. patent application Ser. No. 16/675,655, filed on Nov. 6, 2019, the entire disclosure of each of which is incorporated by reference herein.

In various embodiments, a controller may control the motion of the laser head or output beam relative to the workpiece via control of, e.g., one or more actuators. The controller may be present in laser systems and/or kits as disclosed herein. The controller may also operate a conventional positioning system configured to cause relative movement between the output laser beam and the workpiece being processed. For example, the positioning system may be any controllable optical, mechanical or opto-mechanical system for directing the beam through a processing path along a two- or three-dimensional workpiece. During processing, the controller may operate the positioning system and the laser system so that the laser beam traverses a processing path along the workpiece. The processing path may be provided by a user and stored in an onboard or remote memory, which may also store parameters relating to the type of processing (cutting, welding, etc.) and the beam parameters necessary to carry out that processing. The stored values may include, for example, beam wavelengths, beam shapes, beam polarizations, etc., suitable for various processes of the material (e.g., piercing, cutting, welding, etc.), the type of processing, and/or the geometry of the processing path.

As is well understood in the plotting and scanning art, the requisite relative motion between the output beam and the workpiece may be produced by optical deflection of the beam using a movable mirror, physical movement of the laser using a gantry, lead-screw or other arrangement, and/or a mechanical arrangement for moving the workpiece rather than (or in addition to) the beam. The controller may, in some embodiments, receive feedback regarding the position and/or processing efficacy of the beam relative to the workpiece from a feedback unit, which will be connected to suitable monitoring sensors.

The controller may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C #, BASIC, various scripting languages, and/or HTML. Additionally, the software may be implemented in an assembly language directed to the microprocessor resident on a target computer; for example, the software may be implemented in Intel 80x86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In addition, the laser system may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the output beam to optimize the processing (e.g., cutting, piercing, or welding) of the workpiece, e.g., in accordance with records in the database corresponding to the type of material being processed.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A kit for situating an optic in a laser system, the kit comprising:
   the optic;
   a mechanical mount comprising, in or on a top surface thereof, (i) an optic cradle configured to receive the optic therein, and (ii) a spring cradle configured to receive a spring therein;
   a spring having (i) first and second contact points configured to contact the optic, (ii) a central bend between the first and second contact points, and (iii) first and second base portions, opposite the first and second contact points, configured to contact a portion of the spring cradle, whereby, when the optic is received in the optic cradle and the spring is received in the spring cradle, spring force exerted by the spring fixes the optic in place in the optic cradle; and
   a tool comprising:
      a body having a first end and a second end opposite the first end,
      extending from the first end of the body, an engagement mechanism for engaging the central bend of the spring,
      an actuator for controlling motion of the engagement mechanism, and
      a control mechanism mechanically coupling the actuator and the engagement mechanism.

2. The kit of claim 1, wherein the control mechanism is at least partially disposed within the body.

3. The kit of claim 1, wherein the control mechanism comprises a rack-and-pinion gearing system.

4. The kit of claim 1, wherein the engagement mechanism comprises a hook or a grasper.

5. The kit of claim 1, wherein the actuator comprises a button or a plunger.

6. The kit of claim 1, wherein the tool comprises, disposed on the first end of the body, a stabilizer configured to engage with a front surface of the mount when the engagement mechanism is positioned to engage with the central bend of the spring.

7. The kit of claim 1, wherein the control mechanism is configured to retract the engagement mechanism toward the second end of the body when the actuator is pressed.

8. The kit of claim 1, wherein the tool comprises first and second opposed projections, extending from a lateral portion of the tool between the first and second ends, configured to receive one or more fingers of a user.

9. The kit of claim 1, wherein the spring consists of a single length of elastic material having first and second ends, the length of elastic material comprising first and second off-center bends providing the first and second base portions, the central bend being generally U-shaped and defining the first and second contact portions, the first and second contact portions being opposed to each other across the central bend to thereby resist compression of the first and second contact portions toward the first and second base portions.

10. The kit of claim 9, wherein the first and second base portions are within 5° of collinearity, and the first and second ends of the length of elastic material face each other.

11. The kit of claim 9, wherein each of first and second contact portions is opposed to and bowed away from one of the first and second base portions.

12. The kit of claim 9, wherein the first and second ends are spaced apart from each other.

13. The kit of claim 9, wherein the length of elastic material comprises (i) a first linear segment disposed between the first off-center bend and the first contact portion and (ii) a second linear segment disposed between the second off-center bend and the second contact portion.

14. The kit of claim 9, wherein a radius of the central bend is less than a radius of the first off-center bend and less than a radius of the second off-center bend.

15. The kit of claim 9, wherein a width of the spring between the first and second off-center bends is greater than a depth of the spring between the contact points and the base portions.

16. The kit of claim 9, wherein a distance between the first and second contact portions ranges from approximately 40% to approximately 60% of a width of the spring between the first and second off-center bends.

17. The kit of claim 1, wherein the spring comprises a metal or metal alloy.

18. The kit of claim 1, wherein the optic comprises a reflector, a polarizer, a waveplate, a diffuser, a lens, or a diffraction grating.

19. The kit of claim 1, wherein the mechanical mount defines therethrough one or more mounting holes.

* * * * *